US008922198B2

(12) United States Patent
Almalki et al.

(10) Patent No.: US 8,922,198 B2
(45) Date of Patent: Dec. 30, 2014

(54) SYSTEM AND METHOD FOR CALIBRATING A MAGNETOMETER ACCORDING TO A QUALITY THRESHOLD

(75) Inventors: Nazih Almalki, Waterloo (CA); Christopher Harris Snow, Kitchener (CA); Jeffrey Alton Hugh Dods, Kitchener (CA); Adam Louis Parco, Kitchener (CA)

(73) Assignee: Blackberry Limited, Waterloo (CA)

( * ) Notice: Subject to any disclaimer, the term of this patent is extended or adjusted under 35 U.S.C. 154(b) by 581 days.

(21) Appl. No.: 13/235,824

(22) Filed: Sep. 19, 2011

(65) Prior Publication Data

US 2012/0096921 A1 Apr. 26, 2012

Related U.S. Application Data

(60) Provisional application No. 61/406,879, filed on Oct. 26, 2010.

(51) Int. Cl.
*G01R 35/00* (2006.01)
*G01C 17/38* (2006.01)
*H04M 1/725* (2006.01)
*H04M 1/02* (2006.01)

(52) U.S. Cl.
CPC ............ *G01C 17/38* (2013.01); *H04M 1/72569* (2013.01); *H04M 1/0214* (2013.01); *H04M 1/72544* (2013.01); *H04M 2250/12* (2013.01)
USPC ....................................................... 324/202

(58) Field of Classification Search
USPC ....................................................... 324/202
See application file for complete search history.

(56) References Cited

U.S. PATENT DOCUMENTS

| | | |
|---|---|---|
| 5,151,872 A | 9/1992 | Suzuki et al. |
| 5,297,065 A | 3/1994 | Cage et al. |
| 5,581,899 A | 12/1996 | Breher et al. |
| 5,694,037 A | 12/1997 | Palstra et al. |
| 5,737,226 A | 4/1998 | Olson et al. |
| 6,130,534 A | 10/2000 | Huang et al. |
| 6,286,221 B1 | 9/2001 | Voto et al. |
| 6,408,251 B1 | 6/2002 | Azuma |
| 6,543,416 B2 | 4/2003 | Kowatari et al. |
| 6,857,194 B2 | 2/2005 | Parks et al. |
| 6,871,411 B1 | 3/2005 | Kang et al. |
| 6,922,647 B2 | 7/2005 | Cho et al. |
| 7,053,608 B2 | 5/2006 | Friend et al. |
| 7,119,533 B2 | 10/2006 | Tamura et al. |

(Continued)

FOREIGN PATENT DOCUMENTS

JP 2008-241675 A 10/2008

OTHER PUBLICATIONS

Extract from "Calibrating the Digital Compass on the HTC Magic"; Mar. 16, 2010; http://www.androidza.co.za/calibrating-the-digital-compass-on-the-htc-magic/.

(Continued)

*Primary Examiner* — Bot Ledynh
(74) *Attorney, Agent, or Firm* — Brett J. Slaney; Blake, Cassels & Graydon LLP

(57) ABSTRACT

A method and system are provided for calibrating a magnetometer. The method comprises determining a current quality level associated with magnetometer readings obtained using an active set of calibration parameters; and lowering a quality threshold for a background calibration of the magnetometer when the current quality level exceeds a threshold quality level needed by an application utilizing the magnetometer readings.

18 Claims, 18 Drawing Sheets

(56) References Cited

U.S. PATENT DOCUMENTS

| | | | |
|---|---|---|---|
| 7,127,823 | B2 | 10/2006 | Parks et al. |
| 7,146,740 | B2 | 12/2006 | Manfred |
| 7,191,533 | B2 | 3/2007 | Parks et al. |
| 7,210,236 | B2 | 5/2007 | Sato et al |
| 7,249,419 | B2 | 7/2007 | Sato |
| 7,275,008 | B2 | 9/2007 | Plyvanainen |
| 7,322,117 | B2 | 1/2008 | Olson et al. |
| 7,324,906 | B2 | 1/2008 | Sato et al. |
| 7,331,115 | B2 | 2/2008 | Schierbeek et al. |
| 7,346,995 | B2 | 3/2008 | Olson et al. |
| 7,353,814 | B2 | 4/2008 | Hirowatari et al. |
| 7,363,718 | B2 | 4/2008 | Sato et al. |
| 7,451,549 | B1 | 11/2008 | Sodhi et al. |
| 7,458,166 | B2 | 12/2008 | Parks et al. |
| 7,532,991 | B2 | 5/2009 | Handa |
| 7,613,581 | B2 | 11/2009 | Skvortsov et al. |
| 7,637,024 | B2 | 12/2009 | Amundson et al. |
| 7,643,939 | B2 | 1/2010 | Zeng et al. |
| 7,676,341 | B2 | 3/2010 | Handa |
| 7,814,671 | B2 | 10/2010 | Okeya |
| 7,818,136 | B2 | 10/2010 | Chen et al. |
| 7,835,879 | B2 | 11/2010 | Vocali et al. |
| 2002/0092188 | A1 | 7/2002 | Smith |
| 2003/0023380 | A1 | 1/2003 | Woloszyk et al. |
| 2007/0156337 | A1 | 7/2007 | Yanni |
| 2007/0288166 | A1 | 12/2007 | Ockerse et al. |
| 2008/0243417 | A1 | 10/2008 | Yanni et al. |
| 2008/0270060 | A1 | 10/2008 | Dunne |
| 2009/0070056 | A1 | 3/2009 | Vocali et al. |
| 2009/0070057 | A1 | 3/2009 | Hirobe et al. |
| 2009/0167295 | A1 | 7/2009 | Chen et al. |
| 2009/0254294 | A1 | 10/2009 | Dutta |
| 2010/0109950 | A1 | 5/2010 | Roh |
| 2010/0121599 | A1 | 5/2010 | Boeve et al. |
| 2010/0164479 | A1 | 7/2010 | Alameh et al. |
| 2010/0307015 | A1 | 12/2010 | Mayor et al. |
| 2010/0307016 | A1 | 12/2010 | Mayor et al. |
| 2010/0312509 | A1 | 12/2010 | Patel et al. |
| 2010/0312510 | A1 | 12/2010 | Piemonte et al. |
| 2010/0312513 | A1 | 12/2010 | Mayor et al. |

OTHER PUBLICATIONS

Extract from Honeywell Magnetic Sensor Products, Electronic Compass Design Guide Using the HMC5843 Digital Compass IC; Online at least as early as Oct. 2010; Honeywell; Online at corvusm3.googlecode.com/files/DesignGuide5843revB.pdf.

Pylvanainen, T.; Abstract from "Automatic and adaptive calibration of 3D field sensors"; Applied Mathematical Modelling; Apr. 2008; vol. 32, Issue 4.

Extract from Honeywell Design Guide: Electronic Compass Design Guide / Using the HMC5843 Digital Compass IC; Jun. 2010; Honeywell; Online at http://www51.honeywell.com/aero/common/documents/myaerospacecatalog-documents/Defense_Brochures-documents/HMC5843.pdf.

Valenti, C.; Microchip AN996: Designing a Digital Compass Using the PIC18F2520; Jul. 1, 2005; Microchip Technology Inc.; Online at http://ww1.microchip.com/downloads/en/AppNotes/00996a.pdf.

Motodev>Products>Milestone™ A853; Online at least as early as Oct. 2010; Online at http://developer.motorola.com/products/milestone-a853/.

Borgmann, J. et al.; Abstract from "Compensation techniques for HTS-rf-SQUID magnetometers operating in unshielded environments"; Applied Superconductivity; Jul. 12, 1997; vol. 5, Issues 7-12; Elsevier Science Ltd.

Včelák, J. et al.; Abstract from "Errors of AMR compass and methods of their compensation"; Sensors and Actuators A: Physical; May 24, 2006; Elsevier Science Ltd.; EMSA 2004—Selected Papers from the 5th European Magnetic Sensors & Actuators Conference—EMSA 2004, Cardiff, UK, Jul. 4 to 6, 2004.

Premerlani, W.; "Magetometer Offset Cancellation: Theory and Implementation"; Apr. 11, 2010; Online at gentlenav.googlecode.com/files/MagnetometerOffsetNulling.pdf.

ESA Science & Technology: Instruments; Jan. 20, 2011; European Space Agency; http://sci.esa.int/science-e/www/object/printfriendly.cfm?fobjectid=33964&fbodylongid=1443.

Burkhalter, K.; Extract from blog "iPhone 3GS Compass Calibration"; Jul. 3, 2009; http://www.iphonelife.com/blog/2440/iphone-3gs-compass-calibration.

Magnetometer with magnetoresistive sensor KMZ10 / KMZ51; Honeywell Sensors HMC1001-HMC1002-HMC1021-HMC1022; published at least as early as Oct. 6, 2010.

Vissiere, D. et al.; "Using magnetic disturbances to improve IMU-based position estimation"; 2007; Proceedigs of the European Control Conference, Jul. 2 to 5, 2007, Kos, Greece; pp. 2853 to 2858.

Dorveaux, E.; "Iterative calibration method for inertial and magnetic sensors"; 2009; Joint 48th IEEE Conference on Decision and Control, 28th Chinese Control Conference, Dec. 16 to 18, 2010, Shanghai, China.

Esfandyari, J. et al.; "MEMS pressure sensors in pedestrian navigation"; Dec. 1, 2010; Online at http://www.sensorsmag.com/electronics-computers/consumer/mems-pressure-sensors-pedestrian-navigation-7896.

Bohm-Pelissier, A.; Search Report from corresponding European Application No. 11181830.8; search completed Oct. 19, 2011.

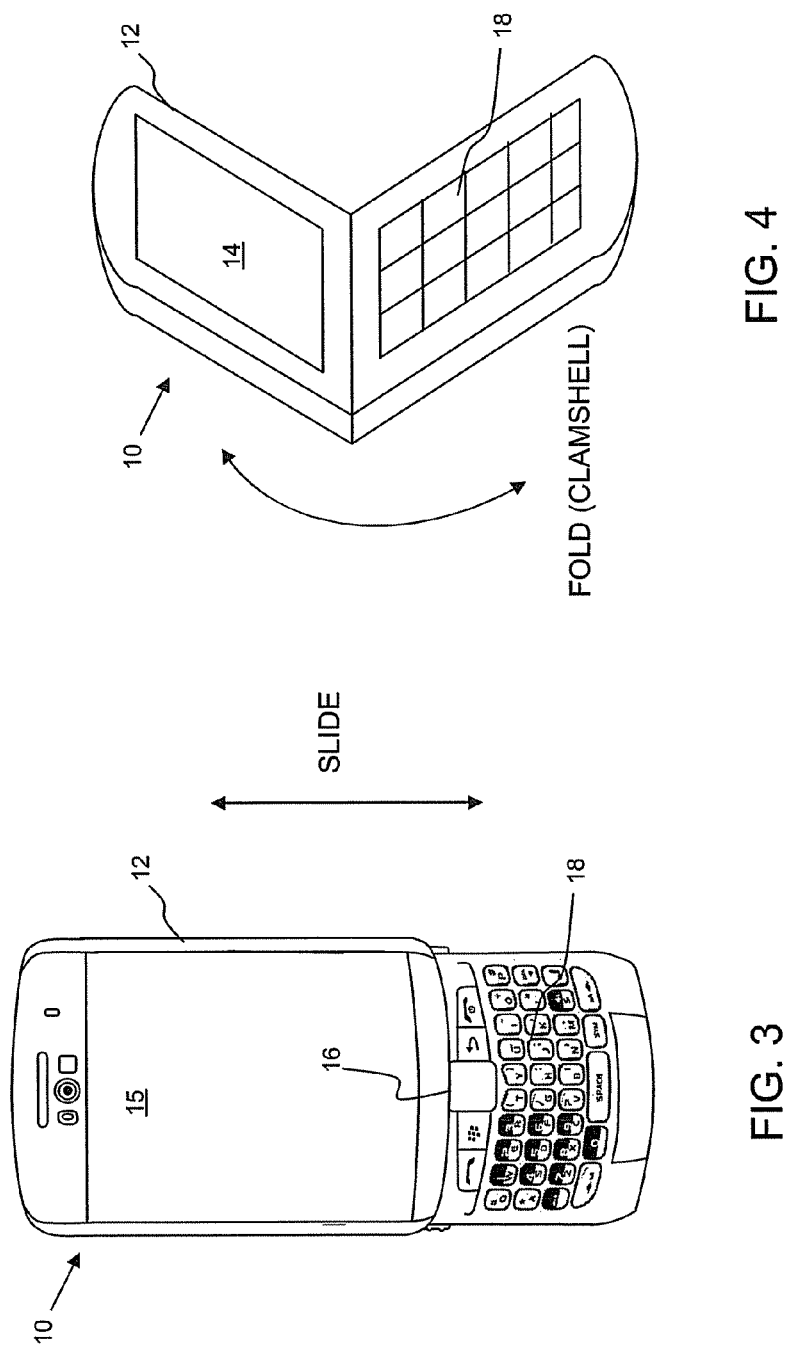

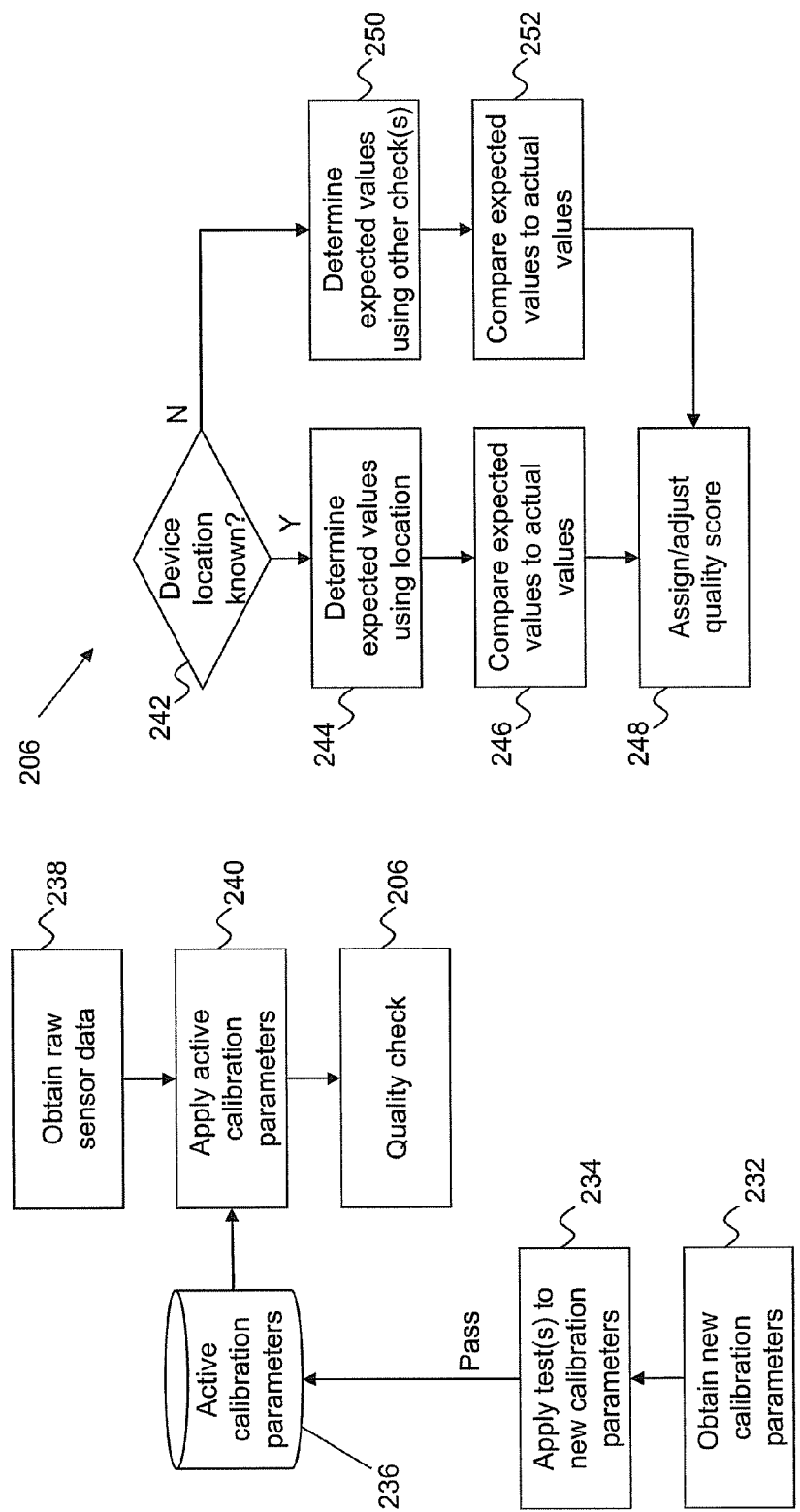

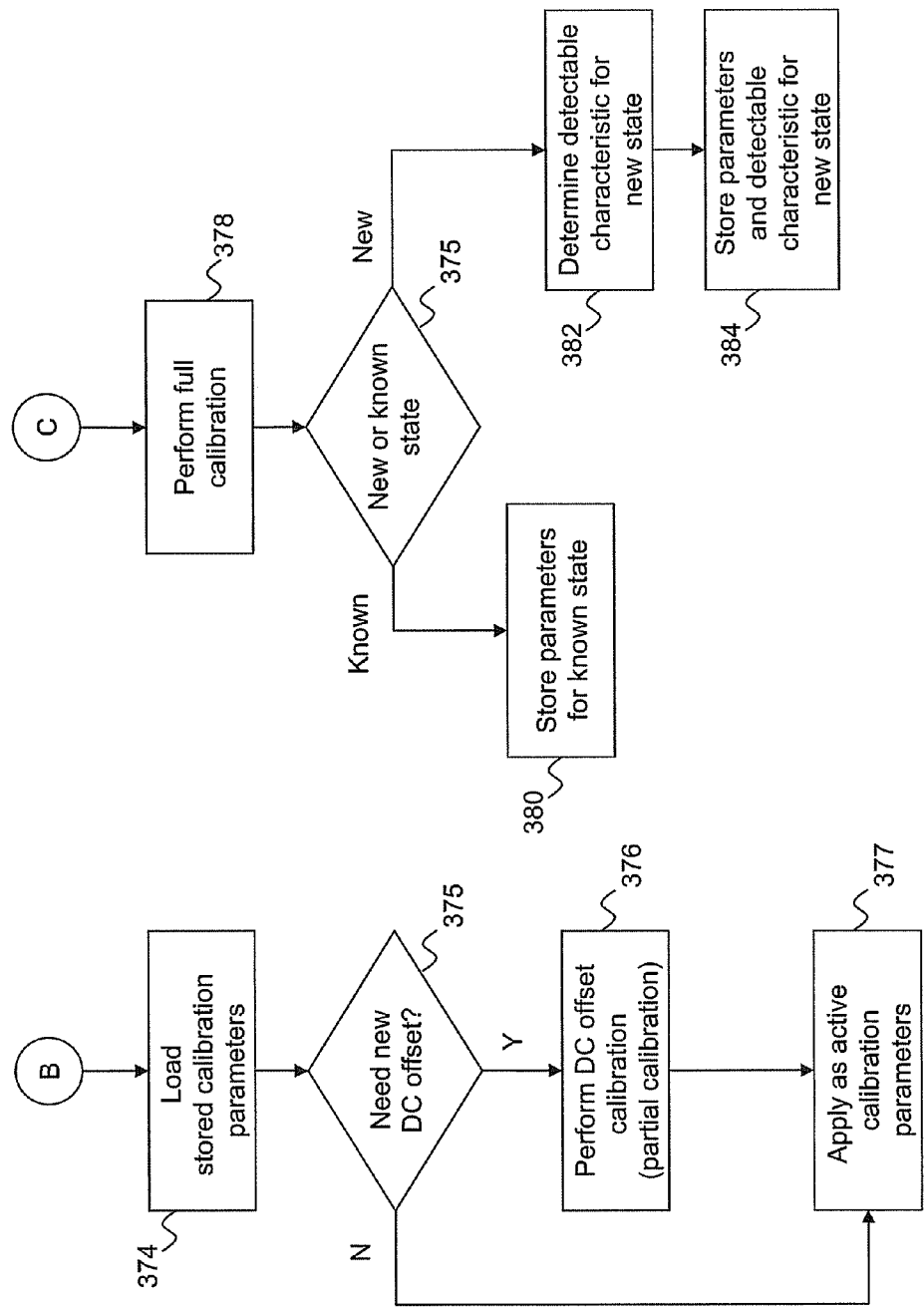

SYSTEM AND METHOD FOR CALIBRATING A MAGNETOMETER ACCORDING TO A QUALITY THRESHOLD

This application claims priority from U.S. Provisional Application No. 61/406,879 filed on Oct. 26, 2010, the contents of which are incorporated herein by reference.

TECHNICAL FIELD

The following relates to systems and methods for calibrating a magnetometer according to a quality threshold.

BACKGROUND

A magnetometer is an instrument used to measure the strength and/or direction of the magnetic field in the vicinity of the instrument. Many electronic devices exist that utilize a magnetometer for taking measurements for a particular application, e.g. metal detectors, geophysical instruments, aerospace equipment, and mobile communications devices such as cellular telephones, PDAs, smart phones, tablet computers, etc., to name a few.

Devices that comprise a magnetometer and have a display and processing capabilities, e.g., a smart phone, may include a compass application for showing a direction on the display.

Mobile communication devices, such as those listed above, can operate in many different locations and under various circumstances. Changes in the environment in which the device operates can affect the operation of the magnetometer. As such, the magnetometer may need to be calibrated at certain times.

BRIEF DESCRIPTION OF THE DRAWINGS

Embodiments will now be described by way of example only with reference to the appended drawings wherein:

FIG. 3 is a perspective view of an example of a mobile device comprising a slidable keyboard assembly.

FIG. 4 is a perspective view of an example of a mobile device comprising a clam-shell type foldable housing.

FIG. 8 is a flow chart including an example of a set of computer executable operations for testing a new set of calibration parameters and using the new set of calibration parameters as an active set of calibration parameters.

FIG. 9 is a flow chart including an example of a set of computer executable operations for performing a quality check on data subsequent to application of the active set of calibration parameters tested in FIG. 8.

FIG. 23 is a flow chart including an example of a set of computer executable operations for loading stored calibration parameters for a detected device state.

FIG. 24 is a flow chart including an example of a set of computer executable operations for determining new calibration parameters for a device state.

DETAILED DESCRIPTION OF THE DRAWINGS

It has been found that to accommodate changing environments, electronic devices which utilize a magnetometer can perform ongoing calibrations. Such calibrations can be automatically triggered (e.g. ongoing or periodic calibrations) or triggered by an application or external event or change of state of the device.

Although the following examples are presented in the context of mobile communication devices, the principles may equally be applied to other devices such as applications running on personal computers, embedded computing devices, other electronic devices, and the like.

For clarity in the discussion below, mobile communication devices are commonly referred to as "mobile devices" for brevity. Examples of applicable mobile devices include without limitation, cellular phones, cellular smart-phones, wireless organizers, pagers, personal digital assistants, computers, laptops, handheld wireless communication devices, wirelessly enabled notebook computers, portable gaming devices, tablet computers, or any other portable electronic device with processing and communication capabilities.

Figure 2:
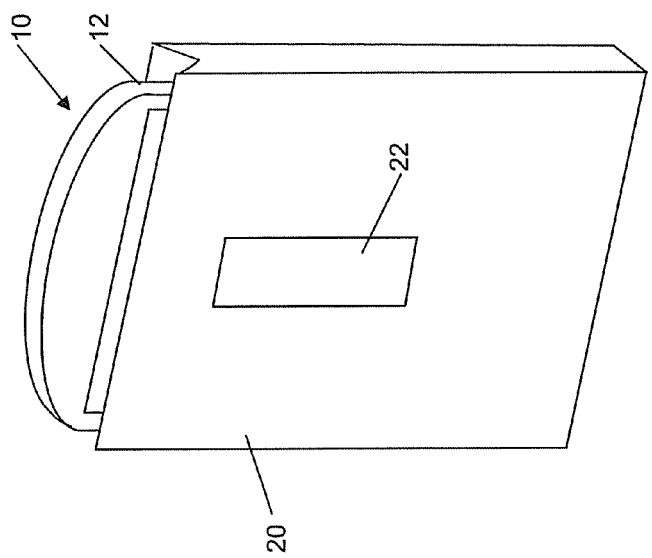
FIG. 2 is a perspective view of an example of a mobile device while holstered.
Figure 1:
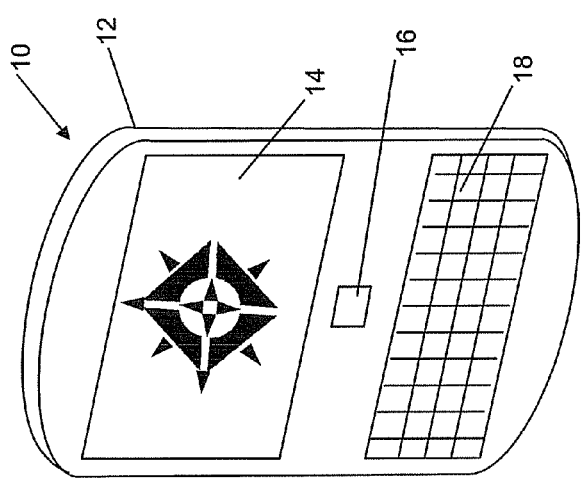
FIG. 1 is a perspective view of an example of a mobile device displaying an electronic compass.

An exterior view of an example mobile device 10 is shown in FIG. 1 The mobile device 10 in this example comprises a housing 12 which supports a display 14, a positioning device 16 (e.g. track pad, track ball, track wheel, etc.), and a keyboard 18. The keyboard 18 may comprise a full-Qwerty (as shown) set of keys but may also provide a reduced Qwerty set of keys (not shown) in other embodiments. FIG. 2 illustrates a complementary holster 20 for the mobile device 10. The holster 20 is typically used to stow and protect the outer surfaces of the housing 12, display 14, positioning device 16, keyboard 18, etc. and may be used to trigger other features such as a notification profile, backlight, phone answer/hang-up functions, etc. In this example, the holster 20 comprises a clip 22 to facilitate supporting the holster 20 and thus the mobile device 10 on a belt or other object.

It can be appreciated that the mobile devices 10 shown in FIGS. 1 and 2 are provided as examples for illustrative purposes only. For example, FIG. 3 illustrates another mobile device 10, which comprises a touchscreen display 15 and a "slide-out" keyboard 18. In operation, the touchscreen display 15 can be used to interact with applications on the mobile device 10 and the keyboard 18 may be slid out from behind the touchscreen display 15 as shown, when desired, e.g. for typing or composing an email, editing a document, etc. FIG. 4 illustrates yet another example embodiment of a mobile device 10, wherein the housing 12 provides a foldable or flippable, clamshell type mechanism to fold the display 14 towards the keyboard 18 to effectively transition the mobile device 10 between an operable or open state and a standby or closed state. It can be appreciated that the clamshell type housing 12 as shown in FIG. 4 can be used to trigger an "answer" operation when changing from the closed state to the open state and, conversely, can trigger an "end" or "hang-up" operation when changing from the open state to the closed state.

The holstered state shown in FIG. 2 and the slide and folded states shown in FIGS. 3 and 4 illustrate that the mobile device 10 may assume various states depending on the type of device and its various features. As will be discussed below in greater detail, it has been recognized that magnetic effects can change or be otherwise influenced by the state of the mobile device 10, in particular when magnetic members (e.g. magnets) are used to detect or trigger a change in the operation of the mobile device 10 due to a change in configuration thereof. Since changing magnetic influences can affect a magnetometer and its accuracy, it has been found that changes in state of the mobile device 10 can be used to trigger a calibration of the magnetometer in order to compensate for any degradation of the accuracy of the magnetometer due to the magnetic influences.

Figure 5:
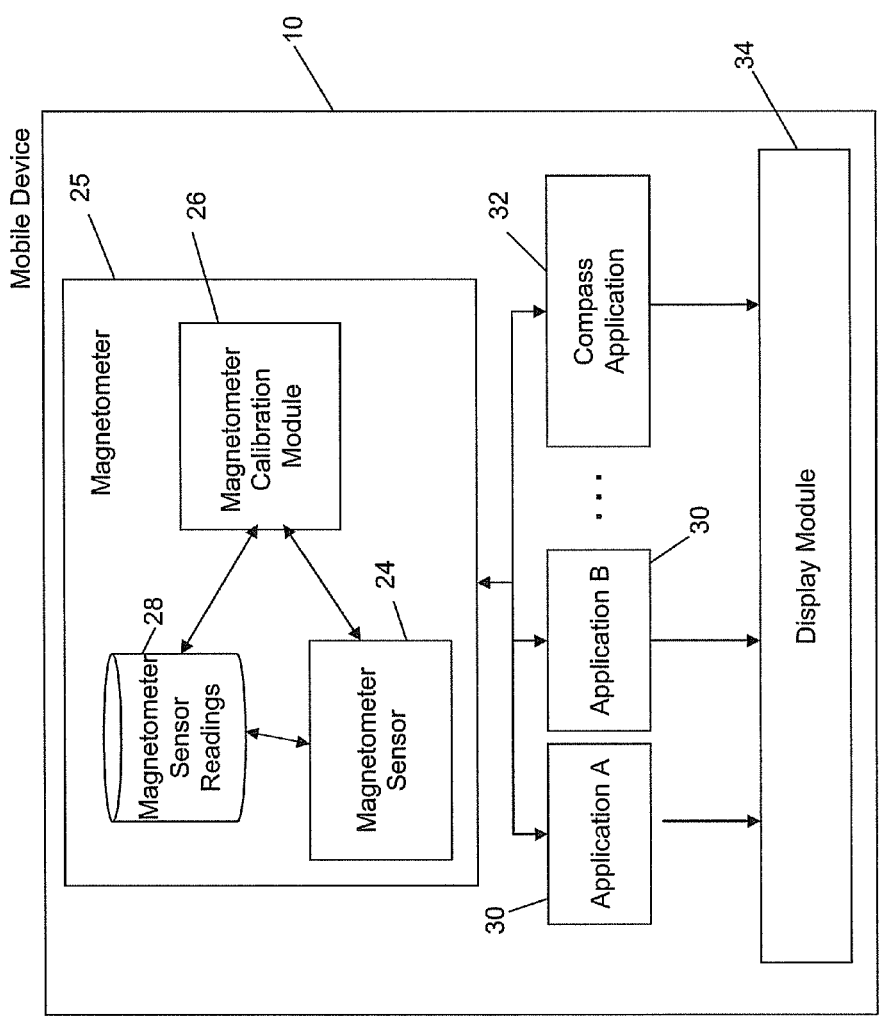
FIG. 5 is a block diagram of an example of a configuration for a mobile device comprising a magnetometer calibration module.

An example of a configuration for a mobile device 10 comprising a magnetometer 25 is shown in FIG. 5. The magnetometer 25 in this example embodiment comprises a magnetometer sensor 24 which, when operable, obtains or otherwise acquires readings including the direction of the magnetic field and its strength. Such readings are stored in a data store of magnetometer sensor readings 28. Various applications 30 may utilize the stored magnetometer sensor readings 28. In this example, a compass application 32 is shown specifically. It can be appreciated that the other applications 30 may include any application that can make use of magnetometer readings 28, for example, a stud finder application, metal detector application, augmented reality based application, etc. The applications 30, 32 may then use such readings to provide a user interface (UI) using a display module 34, e.g. a real-time compass showing the mobile device's heading as shown in FIG. 1. It can be appreciated that various components of the mobile device 10 are omitted from FIG. 5 for ease of illustration. The magnetometer 25 in this example embodiment also comprises or otherwise has access to a magnetometer calibration module 26 which, as will be discussed below, can be used to calibrate the magnetometer sensor 24 to improve the quality of the magnetometer sensor readings 28.

Figure 6:
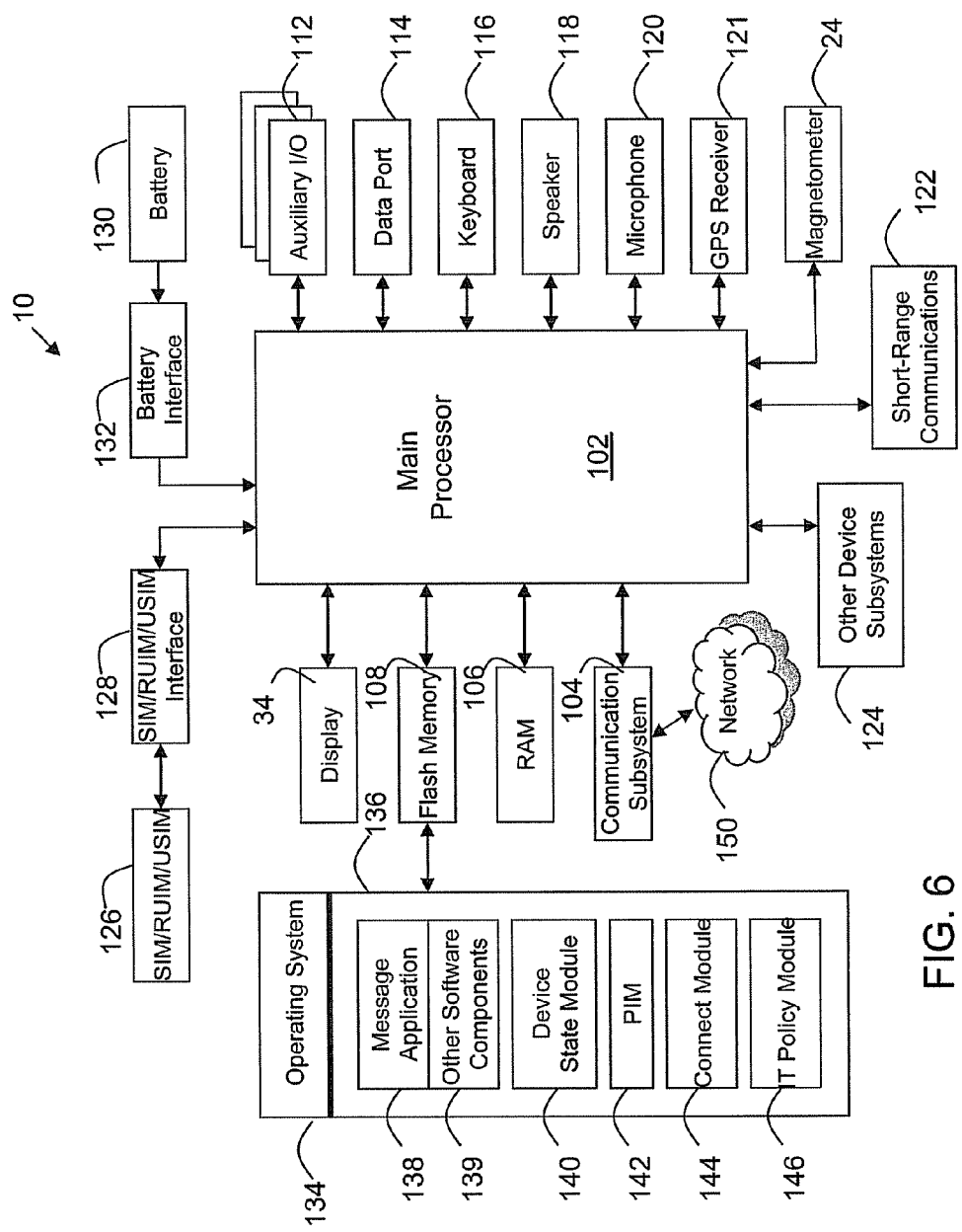
FIG. 6 is a block diagram of an example of a configuration for a mobile device.

Referring now to FIG. 6, shown therein is a block diagram of an example of an embodiment of a mobile device 10. The mobile device 10 comprises a number of components such as a main processor 102 that controls the overall operation of the mobile device 10. Communication functions, including data and voice communications, are performed through a communication subsystem 104. The communication subsystem 104 receives messages from and sends messages to a wireless network 150. In this example embodiment of the mobile device 10, the communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by 3G and 4G networks such as EDGE, UMTS and HSDPA, LTE, Wi-Max etc. New standards are still being defined, but it is believed that they will have similarities to the network behaviour described herein, and it will also be understood by persons skilled in the art that the embodiments described herein are intended to use any other suitable standards that are developed in the future. The wireless link connecting the communication subsystem 104 with the wireless network 150 represents one or more different Radio Frequency (RF) channels, operating according to defined protocols specified for GSM/GPRS communications. With newer network protocols, these channels are capable of supporting both circuit switched voice communications and packet switched data communications.

The main processor 102 also interacts with additional subsystems such as a Random Access Memory (RAM) 106, a flash memory 108, a display 34, an auxiliary input/output (I/O) subsystem 112, a data port 114, a keyboard 116, a speaker 118, a microphone 120, GPS receiver 121, magnetometer 24, short-range communications 122, and other device subsystems 124.

Some of the subsystems of the mobile device 10 perform communication-related functions, whereas other subsystems may provide "resident" or on-device functions. By way of example, the display 34 and the keyboard 116 may be used for both communication-related functions, such as entering a text message for transmission over the network 150, and device-resident functions such as a calculator or task list.

The mobile device 10 can send and receive communication signals over the wireless network 150 after required network registration or activation procedures have been completed. Network access is associated with a subscriber or user of the mobile device 10. To identify a subscriber, the mobile device 10 may use a subscriber module. Examples of such subscriber modules include a Subscriber Identity Module (SIM) developed for GSM networks, a Removable User Identity Module (RUIM) developed for CDMA networks and a Universal Subscriber Identity Module (USIM) developed for 3G networks such as UMTS. In the example shown, a SIM/RUIM/USIM 126 is to be inserted into a SIM/RUIM/USIM interface 128 in order to communicate with a network. The SIM/RUIM/USIM component 126 is one type of a conventional "smart card" that can be used to identify a subscriber of the mobile device 10 and to personalize the mobile device 10, among other things. Without the component 126, the mobile device 10 may not be fully operational for communication with the wireless network 150. By inserting the SIM/RUIM/USIM 126 into the SIM/RUIM/USIM interface 128, a subscriber can access all subscribed services. Services may include: web browsing and messaging such as e-mail, voice mail, SMS, and MMS. More advanced services may include: point of sale, field service and sales force automation. The SIM/RUIM/USIM 126 includes a processor and memory for storing information. Once the SIM/RUIM/USIM 126 is inserted into the SIM/RUIM/USIM interface 128, it is coupled to the main processor 102. In order to identify the subscriber, the SIM/RUIM/USIM 126 can include some user parameters such as an International Mobile Subscriber Identity (IMSI). An advantage of using the SIM/RUIM/USIM 126 is that a subscriber is not necessarily bound by any single physical mobile device. The SIM/RUIM/USIM 126 may store additional subscriber information for a mobile device as well, including datebook (or calendar) information and recent call information. Alternatively, user identification information can also be programmed into the flash memory 108.

The mobile device 10 is typically a battery-powered device and may include a battery interface 132 for receiving one or more batteries 130 (typically rechargeable). In at least some embodiments, the battery 130 can be a smart battery with an embedded microprocessor. The battery interface 132 is coupled to a regulator (not shown), which assists the battery 130 in providing power V+ to the mobile device 10. Although current technology makes use of a battery, future technologies such as micro fuel cells may provide the power to the mobile device 10.

The mobile device 10 also includes an operating system (OS) 134 and software components 136 to 146. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, may be installed on the mobile device 10 during its manufacture. Other software applications include a message application 138 that can be any suitable software program that allows a user of the mobile device 10 to send and receive electronic messages. Various alternatives exist for the message application 138 as is well known to those skilled in the art. Messages that have been sent or received by the user are typically stored in the flash memory 108 of the mobile device 10 or some other suitable storage element in the mobile device 10. In at least some embodiments, some of the sent and received messages may be stored remotely from the mobile device 10 such as in a data store of an associated host system that the mobile device 10 communicates with.

The software applications can further comprise a device state module 140, a Personal Information Manager (PIM) 142, and other suitable modules (not shown). The device state module 140 provides persistence, i.e. the device state module 140 ensures that important device data is stored in persistent memory, such as the flash memory 108, so that the data is not lost when the mobile device 10 is turned off or loses power.

The PIM 142 includes functionality for organizing and managing data items of interest to the user, such as, but not limited to, e-mail, contacts, calendar events, voice mails, appointments, and task items. A PIM application has the ability to send and receive data items via the wireless network 150. PIM data items may be seamlessly integrated, synchronized, and updated via the wireless network 150 with the mobile device subscriber's corresponding data items stored and/or associated with a host computer system. This functionality creates a mirrored host computer on the mobile device 10 with respect to such items. This can be particularly advantageous when the host computer system is the mobile device subscriber's office computer system.

The mobile device 10 may also comprise a connect module 144, and an IT policy module 146. The connect module 144 implements the communication protocols that are required for the mobile device 10 to communicate with the wireless infrastructure and any host system, such as an enterprise system, that the mobile device 10 is authorized to interface with.

The connect module 144 includes a set of APIs that can be integrated with the mobile device 10 to allow the mobile device 10 to use any number of services associated with the enterprise system. The connect module 144 allows the mobile device 10 to establish an end-to-end secure, authenticated communication pipe with a host system (not shown). A subset of applications for which access is provided by the connect module 144 can be used to pass IT policy commands from the host system to the mobile device 10. This can be done in a wireless or wired manner. These instructions can then be passed to the IT policy module 146 to modify the configuration of the device 10. Alternatively, in some cases, the IT policy update can also be done over a wired connection.

The IT policy module 146 receives IT policy data that encodes the IT policy. The IT policy module 146 then ensures that the IT policy data is authenticated by the mobile device 100. The IT policy data can then be stored in the flash memory 106 in its native form. After the IT policy data is stored, a global notification can be sent by the IT policy module 146 to all of the applications residing on the mobile device 10. Applications for which the IT policy may be applicable then respond by reading the IT policy data to look for IT policy rules that are applicable.

Other types of software applications or components 139 can also be installed on the mobile device 10. These software applications 139 can be pre-installed applications (i.e. other than message application 138) or third party applications, which are added after the manufacture of the mobile device 10. Examples of third party applications include games, calculators, utilities, etc.

The additional applications 139 can be loaded onto the mobile device 10 through at least one of the wireless network 150, the auxiliary I/O subsystem 112, the data port 114, the short-range communications subsystem 122, or any other suitable device subsystem 124. This flexibility in application installation increases the functionality of the mobile device 10 and may provide enhanced on-device functions, communication-related functions, or both. For example, secure communication applications may enable electronic commerce functions and other such financial transactions to be performed using the mobile device 10.

The data port 114 enables a subscriber to set preferences through an external device or software application and extends the capabilities of the mobile device 10 by providing for information or software downloads to the mobile device 10 other than through a wireless communication network. The alternate download path may, for example, be used to load an encryption key onto the mobile device 10 through a direct and thus reliable and trusted connection to provide secure device communication.

The data port 114 can be any suitable port that enables data communication between the mobile device 10 and another computing device. The data port 114 can be a serial or a parallel port. In some instances, the data port 114 can be a USB port that includes data lines for data transfer and a supply line that can provide a charging current to charge the battery 130 of the mobile device 10.

The short-range communications subsystem 122 provides for communication between the mobile device 10 and different systems or devices, without the use of the wireless network 150. For example, the subsystem 122 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download may be processed by the communication subsystem 104 and input to the main processor 102. The main processor 102 may then process the received signal for output to the display 34 or alternatively to the auxiliary I/O subsystem 112. A subscriber may also compose data items, such as e-mail messages, for example, using the keyboard 116 in conjunction with the display 34 and possibly the auxiliary I/O subsystem 112. The auxiliary subsystem 112 may comprise devices such as: a touch screen, mouse, track ball, infrared fingerprint detector, or a roller wheel with dynamic button pressing capability. The keyboard 116 is an alphanumeric keyboard and/or telephone-type keypad. However, other types of keyboards may also be used. A composed item may be transmitted over the wireless network 150 through the communication subsystem 104.

For voice communications, the overall operation of the mobile device 10 in this example is substantially similar, except that the received signals are output to the speaker 118, and signals for transmission are generated by the microphone 120. Alternative voice or audio I/O subsystems, such as a voice message recording subsystem, can also be implemented on the mobile device 10. Although voice or audio signal output is accomplished primarily through the speaker 118, the display 34 can also be used to provide additional information such as the identity of a calling party, duration of a voice call, or other voice call related information.

It will be appreciated that any module or component exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the mobile device 10 (or other computing or communication device that utilizes similar principles) or accessible or connectable thereto. Any application or module herein described may be implemented using computer readable/executable instructions that may be stored or otherwise held by such computer readable media.

Figure 7:
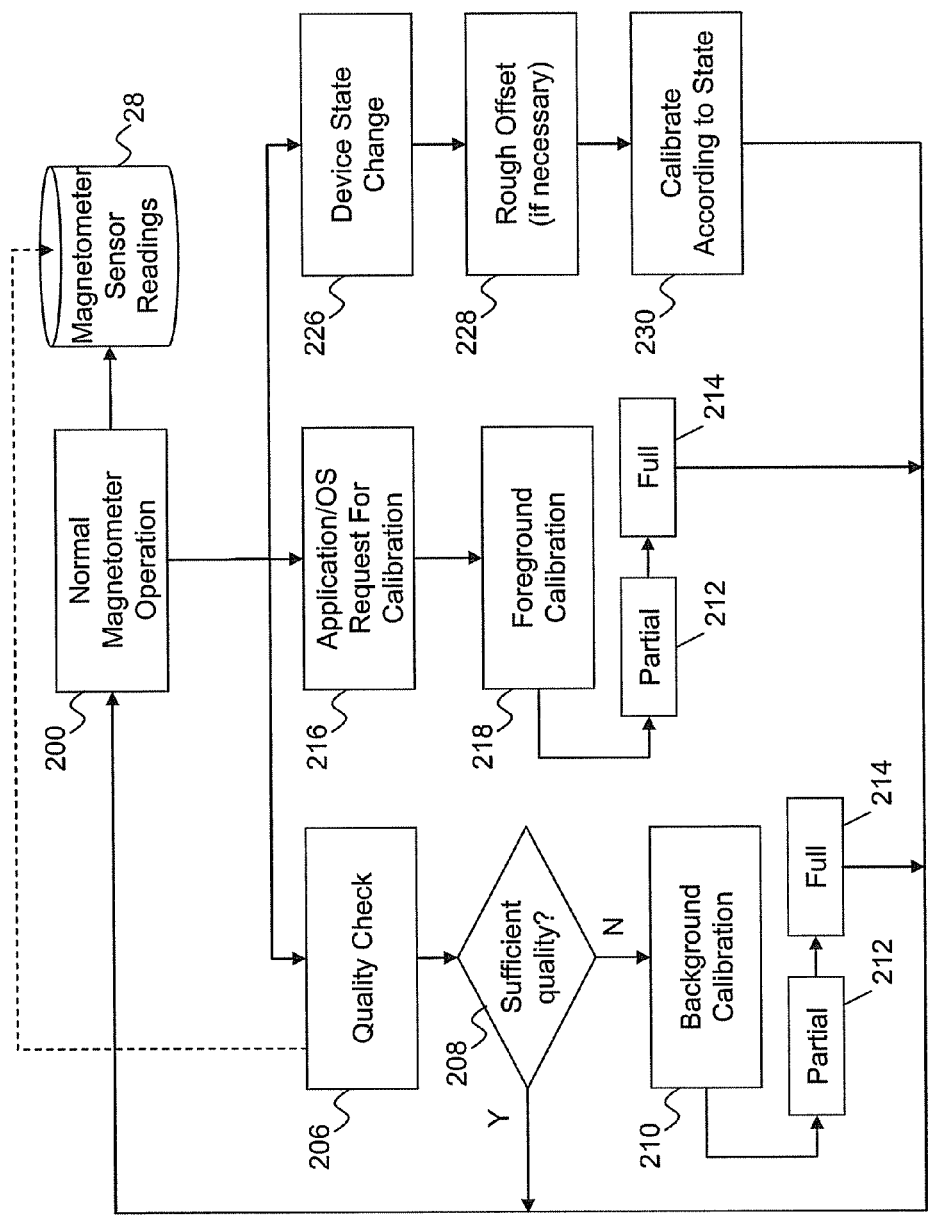
FIG. 7 is a flow chart including an example of a set of computer executable operations for enabling ongoing calibrations of a magnetometer on a mobile device.

FIG. 7 illustrates an example of a set of computer executable operations that may be executed by the magnetometer calibration module 26 in performing requested or ongoing calibrations according to the way in which the mobile device 10 is being used (e.g. according to the states shown in FIGS. 2 to 4) and to compensate for changing environments or conditions. At 200, normal or regular magnetometer operation occurs, wherein the magnetometer sensor 24 is operable to obtain and store magnetometer sensor readings 28. It can be appreciated that the magnetometer 25 is, in an example embodiment, a vector type, three-axis magnetometer 24 that is operable to obtain readings along each of three axes, to measure the component of the magnetic field in a particular direction, relative to the spatial orientation of the magnetometer 24, and thus the mobile device 10. However, the principles discussed below may be at least in part applied to scalar type magnetometers (not shown) in other example embodiments. As noted above, the magnetometer 25 and the magnetometer sensor readings 28 may be utilized by various applications 30, such as the compass application 32 to provide features incorporating a magnetometer reading 28. In order to accommodate changing environments and conditions that may affect (e.g. degrade) the quality of the magnetometer readings 28, e.g. due to the presence of magnetic interference and the like, various calibration processes may be operable to run in the background of what is visible to the user.

The normal magnetometer operation 200 can, in the example embodiment shown in FIG. 7, enter three different branches, depending on certain criteria. A quality check 206 may be performed on a periodic or ongoing basis, regardless of the state of the mobile device 10, i.e. in order to continually assess the quality of measurements obtained by the magnetometer sensor 24. As such, the quality check at 206 may be executed to continually update the magnetometer sensor readings 28 (as shown in dashed lines) so that quality measurements are readily available for performing other calibration operations as will be explained in greater detail below. In order to utilize the quality checks at 206 on an ongoing basis, the magnetometer calibration module 26 can compare the perceived quality of one or more magnetometer readings 28 against a quality threshold at 208. If the quality of the one or more readings is above the threshold, i.e. is/are of sufficient quality, the magnetometer calibration module 26 may return to the normal operation 200 until the next quality check is to be performed at 206, a particular number of magnetometer sensor readings 28 are obtained, or until another criterion or trigger causes a different branch of execution to be followed. If the magnetometer sensor readings 28 is/are not of sufficient quality, a background calibration may be performed at 210, which, in the examples below, utilize both partial and full calibration operations at 212 and 214 respectively. In some cases, the quality checks performed at 206 may be performed often enough that the results of the background calibration at 210 would effectively be evaluated at the next quality check. However, in other cases, the background calibration 210 may rely upon the user moving the mobile device 10 during normal operation 200, which may take some time to complete the calibration. As such, quality checks at 206 may also be performed while the background calibration 210 is ongoing.

During normal operation at 200 a foreground calibration can also be triggered at 218, this example embodiment, after detecting a request for a calibration from an application 30 or the OS 134 at 216. It can be appreciated that the request at 216 can be initiated automatically by the application itself or via detection of a user input (e.g. using a menu as discussed below). As will also be explained in greater detail below, the foreground calibration at 218 also may utilize the same partial 212 and full 214 calibrations and differs from the background calibration at 210 in that a foreground calibration 218 typically relies on active user engagement in order to move the mobile device 10 in various directions (e.g. according to a "gesture"), in order to obtain distinct magnetometer sensor readings 28. By initiating the foreground calibration 218 via the request at 216, the application 30 may be attempting to reach a predetermined level of quality, which may or may not correspond to the highest quality. For example, if there are 5 levels of quality and the application 30 only requires a quality level 3, if the quality at the time of making the request 216 is two (2), the magnetometer calibration module 26 may determine that the magnetometer readings are of sufficient quality for that application 30 at that particular time and thus does not need to continue trying to increase the quality through applying foreground calibration 218. In this way, the magnetometer calibration module 26 can operate more efficiently and require less processing power and in some circumstances fewer user interactions in order to achieve the desired quality.

During normal operation 200, calibration operations can also be triggered based on a detected device state change at 226. For example, by placing the mobile device 10 in the holster 20 (as shown in FIG. 2), by sliding out the keyboard 18 (as shown in FIG. 3), or by closing or opening the clamshell (as shown in FIG. 4), the mobile device 10 would change state, wherein different magnetic influences may apply to each state, as described in greater detail below. To accommodate these changes in state, the magnetometer calibration module 26 can trigger a rough offset at 228 if necessary, and initiate a calibration at 230 that is appropriate for the current state 230. For example, a state change due to holstering a mobile device 10 may require a different calibration than a state change associated with sliding out or "deploying" the keyboard 12.

It can therefore be seen that the magnetometer calibration module 26 can utilize the various calibration operations triggered during normal operation 200 to continually attempt to improve the quality and accuracy of the magnetometer readings 28, as well as to initiate particular calibration routines based on triggers or changes in environment.

FIG. 8 illustrates an example of a set of computer executable operations that may be performed by the magnetometer calibration module 26 in setting or otherwise applying a new set of calibration parameters as the active set of calibration parameters 236, i.e. those calibration parameters currently being used. At 232, the magnetometer calibration module 26 obtains the new set of calibration parameters, e.g. after completing a foreground calibration 218 or background calibration 210. In order to ensure that the newly obtained calibration parameters are of good quality, one or more tests may be applied to the new calibration parameters at 234. For example, as discussed in greater detail below, a number of sanity checks may be applied to ensure that the values for the newly obtained calibration parameters make sense, e.g. according to known limits, ranges, thresholds, etc. This enables the magnetometer calibration module 26 to avoid applying new calibration parameters that are of lower accuracy or quality for the given environment than the active calibration parameters 236, which may be sufficient in any event. By not only checking the quality of the magnetometer sensor readings 28 after the parameters have been applied to the raw sensor data, but also checking the quality of the actual calibration parameters, the magnetometer calibration module 26 can continually adapt to new environments. If the new calibration parameters pass the test(s) at 234, the new calibration parameters are set as the active calibration parameters 236 and are applied thereafter to adjust at 240, raw magnetometer readings obtained at 238.

The magnetometer calibration module 26 may then determine on an ongoing basis, whether or not the active magnetometer parameters 236 can and/or should be improved, e.g. due to a change in environment or other magnetic influences. By performing the quality check at 206, the magnetometer sensor readings 28, after the active calibration parameters 236 have been applied, are evaluated, in an attempt to continually achieve the highest quality that is requested (e.g. by a quality threshold) or possible in the current circumstances.

Turning now to FIG. 9, an example of a set of computer executable instructions is shown for enabling the magnetometer calibration module 26 to apply quality indicators to magnetometer sensor readings 28 during the quality check at 206. Such quality indicators provide quality measures that may then be associated with the corresponding magnetometer sensor readings 28 to enable the magnetometer 25 to provide an indication of quality at the same time that it provides the actual magnetometer sensor reading 28. By applying the quality indicators, the magnetometer calibration module 26 can detect whether or not a current magnetometer calibration (i.e. due to the last calibration performed on the magnetometer sensor 24) is of good or poor quality.

The quality indicators may be used for the calibration of the three-axis magnetometer 25, which may be calibrated using any of the calibration methods described herein, for inaccuracies in gain (which can be different for each axis), a constant bias (which can also be different for each axis), and inter-axis misalignment angles. An example of a constant bias is a direct current (DC) offset, and refers to a steady state bias (i.e. offset) of the sensor axes (e.g. 3 values, 1 per sensor axis for a 3-axis magnetometer). The constant bias is the sensor axes' measurement point of intersection origin, and the Constant bias is usually non-zero, as the Constant bias typically has a bias due to the net effect of the Hard Iron inside the mobile device 10. As such, a calibration of the magnetometer sensor 24 can be performed to improve the accuracy of three calibration parameters, which apply to each axis. As discussed below, in some modes of operation, not all calibration parameters may be used. For example, a mobile device 10 may be operated with a calibration of only gain and constant bias, or be operated with only the constant bias being calibrated.

The quality check 206, as discussed above, may be performed in addition to tests applied to any new calibration parameters that are obtained before the new calibration parameters are set as the active calibration parameters 236. These types of tests may be performed in order to verify that the gain of each axis is within an allowable range as dictated by the particular magnetometer sensor being used, verify that the difference in gains between any two axes is within an allowable range, verify that the constant bias for each axis is within an allowable range, and/or verify that the inter-axis alignment angle for each pair of axes is within an allowable range. If one or more of these tests fails, this may indicate that the calibration is not accurate and thus the calibration may fail or otherwise not be used (i.e. the active calibration parameters would remain as such).

It can be appreciated that the above-noted tests concerning the values of the parameters can be determined based on an understanding of the sensors of a particular magnetometer from a particular vendor that is being used. For example, for a "difference in gains" test, a given vendor may guarantee that a device has gains for each axis that are within 10% of each other. As such, it may be known that this is a maximum allowable difference.

For the constant bias, such as a DC offset, it may be known, for a particular magnetometer of a particular vendor, that the range of values that can be represented. For example, on a particular magnetometer sensor 24, the range of values may be in the range of −2048 to +2047, or some other range. This range can then be used as a bound on the constant bias test.

Similar principles can also be applied for testing the inter-axis alignment and for the gain.

It may also be noted that experience with particular vendors' magnetometers can be relied upon in order to tighten the ranges. For example, if 100,000 devices are built and it is known that the constant bias is never larger than some known values, then these values can be used in the range checks.

The quality check shown in FIG. 9 utilizes indicators based on calibrated magnetometer sensor readings 28, i.e. based on the magnetometer sensor readings 28 once the active calibration parameters 236 have been applied. Once the raw magnetometer sensor readings have been adjusted by applying these calibration parameters, various tests can be performed on the calibrated magnetometer sensor readings 28. In the example shown in FIG. 9, the magnetometer calibration module 26 determines if the location of the mobile device 10 is known at 242, e.g. using GPS data, cell-site geolocation, current timezone, contextual information (e.g. calendar appointment location), or other techniques or data made available to the mobile device 10. If the current location of the mobile device 10 is at least roughly known, predetermined data models can be used to determine the expected magnetic field strength, expected inclination, and expected horizontal field intensity for that current location at 244. An example data model includes the World Magnetic Model (WMM). The measured magnetic field strength, inclination, and horizontal field intensity can then be compared to the expected values obtained from the data model at 246. The amount of deviation between the expected and measured values can then be used as an indicator of the quality of the calibration and/or of magnetic anomalies, and thus be used to assign/adjust the quality score at 248.

For example, if the measured radius of the magnetic field is close to the expected radius of the magnetic field, and the measured inclination is close to the expected inclination, a "High" quality score can be assigned. If the measured radius is close, but the measured inclination is not (e.g., more than 6 degrees different between expected and measured), a Medium quality score can be assigned. If the measured radius is not close, then the quality can be assigned as "Low". It can be appreciated that horizontal field intensity can also be used in a similar way to radius.

If at 242 the magnetometer calibration module 26 determines that location of the mobile device 10 is not known, the expected values noted above can be determined using other one or more other checks at 250 and such expected values can be compared to the measured (actual) values at 252 and the quality score adjusted or assigned accordingly at 248. For example, expected values can be found in the minimum and maximum expected magnetic field strengths over the entire earth, which are well-known. The measured field strength could thus be compared with this range.

It can be appreciated that for inclination, the value can vary from almost +90 degrees to −90 degrees over the Earth, and thus cannot typically be predicted reliably. Horizontal field strength can typically be determined from the model as well (minimum and maximum values over the surface of the Earth). Also, if the mobile device 10 has a cellular radio and the cellular radio is turned on, at least the country in which the mobile device 10 is operating should be determinable. In such cases, the limits can be narrowed (for example, in Canada the inclination is typically between around −60 and −85 degrees).

Figure 11:
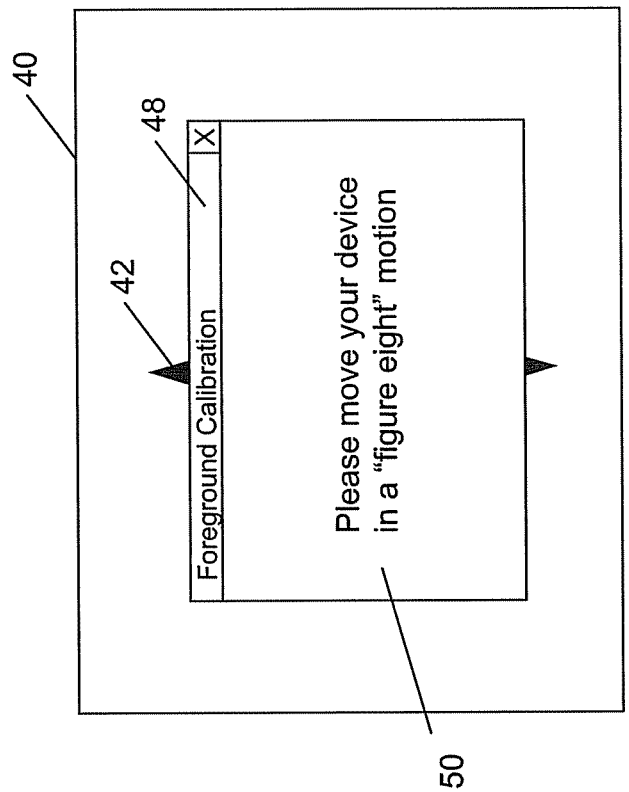
FIG. 11 is a screen shot of an example of a user interface comprising a prompt for confirming initiation of a magnetometer calibration method.
Figure 10:
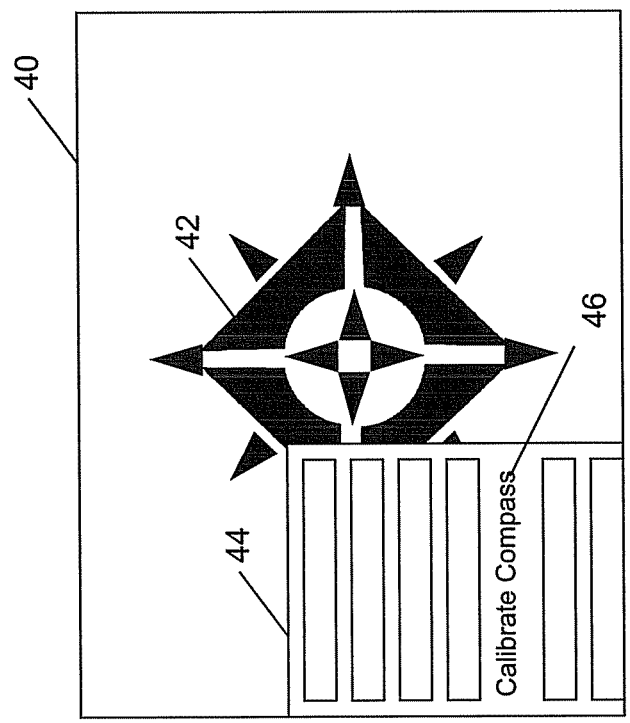
FIG. 10 is a screen shot of an example of a user interface for an electronic compass application.

As discussed above, magnetometer calibrations can be triggered by an application 30 or user interaction. FIG. 10 illustrates an example screen shot of a user interface (UI) 40 for a compass application. In this example, a virtual compass 42 is displayed in the UI 40. If the accuracy of the compass 42 is perceived to be inaccurate or of poor quality, the user may initiate a calibration by invoking a menu 44 as shown in FIG. 10 and selecting a calibrate compass option 46. FIG. 11 illustrates a prompt 48 that may be displayed prior to proceeding with a calibration, e.g. upon the application 30 detecting that a calibration is warranted or upon detecting selection of the calibrate compass option 46 in the menu 44. In this example, the prompt 48 corresponds to the initiation of a foreground calibration 218, which typically requires interaction with the user, for example to have the user move the mobile device 10 around in various directions utilizing various movements. In order to have the user assist with this process, the prompt 48 may be displayed to instruct the user as to how to move their mobile device 10 in order to perform the foreground calibration 218, using a notification 50, in this example: "Please move your device in a "figure eight" motion." It can be appreciated that the prompt 48 can be automatically removed from the screen 40 upon the foreground calibration 218 completing. It can also be appreciated that the notification 50 may include or be replaced by one or more visual elements that illustrate a desired motion or gesture to be performed by the user.

It has been recognized that different applications 30 which utilize the magnetometer 25 may have different calibration quality or accuracy requirements. For example, a "studfinder" application may only require low-quality magnetometer calibrations whereas an augmented reality application may require a relatively higher (or as best as can be achieved) quality magnetometer calibration. The magnetometer calibration module 26 may therefore be operable to control various portions of the calibration method used, according to application requirements. In this way, the number of foreground calibrations 218 that are typically required, can be minimized.

As noted above, as the magnetometer 25 operates, the magnetometer sensor 24 can continually provide magnetometer sensor readings 28, calculate quality measurements (e.g. as shown in FIG. 9), and report the quality measurements along with the magnetometer sensor readings 28. The application 30 making use of the magnetometer 25 thus may receive or otherwise obtain the quality measures at the same time as receiving or obtaining the associated magnetometer sensor readings 28. It has been found that by storing quality measurements on an ongoing basis, an application 30 can use such measurements to determine when to request a calibration at any particular time. For example, the application 30 may rely on a number of quality measures, e.g. last 50, and can use these to average the measures over time. If the application 30 finds that the average quality being reported is not sufficient for its particular needs, the application 30 may then initiate a request to perform a foreground calibration 218.

Figure 12:
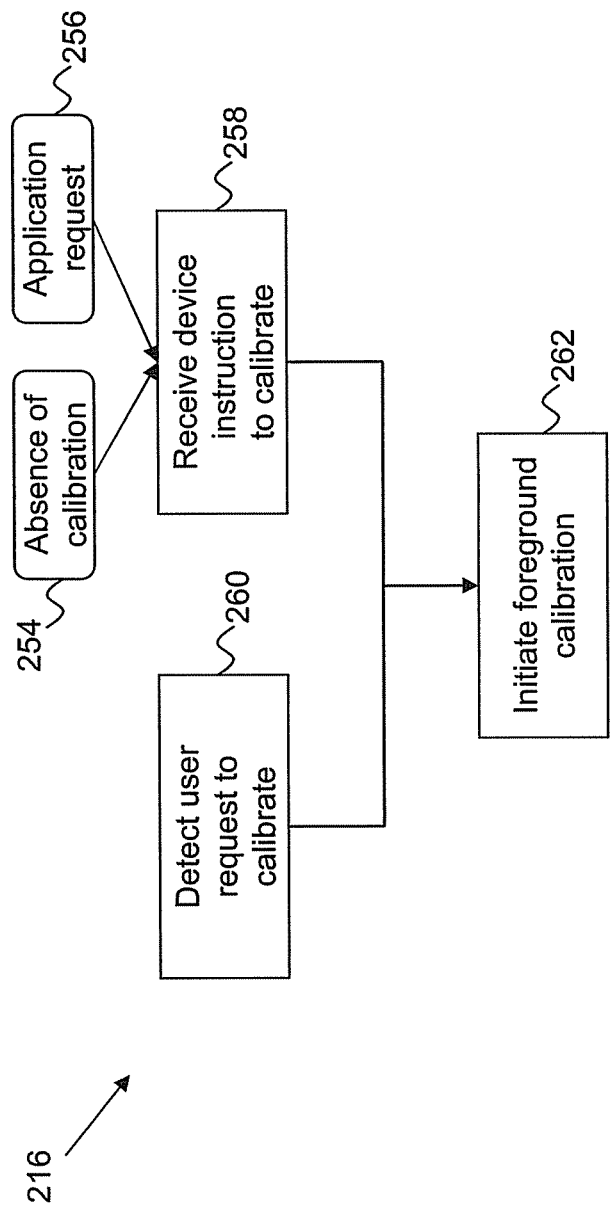
FIG. 12 is a flow chart including an example of a set of computer executable operations for initiating a foreground calibration according to a request from an application.

Turning now to FIG. 12, an example of a set of computer executable instructions are shown, that may be performed by the magnetometer calibration module 26 in handling a request for a calibration from an application 30 or OS 134 at 216 (see also FIG. 7). In general, therefore, the magnetometer calibration module 26 may receive a device instruction at 258. The device instruction received at 258 may originate from the application 30 as an application request at 256, or the device instruction 258 may be automatically triggered by, for example, the OS 134. In FIG. 12, an example of an OS instruction may include detection of the absence of any calibration at 254, which may occur when a mobile device 10 is first used, e.g. The magnetometer calibration module 26 may also detect a user request to calibrate the magnetometer 24 at 260. The magnetometer calibration module 26 may therefore detect the request 216 shown in FIG. 7 in various ways. Once it is determined that a calibration has been requested, the magnetometer calibration module 26 initiates the foreground calibration at 262 (identified using numeral 218 in FIG. 7).

It can be appreciated that while the foreground calibration 218 is being performed, the application 30 may continue to monitor the quality of the magnetometer sensor readings 28, which should improve as the calibration progresses. The foreground calibration 218 may be repeated until the quality is sufficient for the requesting application 30 and its needs.

Once the quality is sufficient, the foreground calibration request can be cancelled. Since more than one application 30 may utilize the magnetometer 25 and the magnetometer sensor readings 28, the magnetometer calibration module 26 can monitor ongoing application requests and, once there are zero outstanding foreground calibration requests, a foreground calibration mode can be terminated. It can be appreciated that by enabling different applications 30 to accept different quality measures, the magnetometer calibration module 26 can optimize processor usage by minimizing the number of foreground calibrations 218 performed. Moreover, since foreground calibrations 218 typically require interaction with the user, such user interactions and the corresponding disruptions can be minimized. Additionally, since the background calibration 210 is, in at least some embodiments performed on an ongoing basis, by accepting a lower quality calibration, can minimize the amount of processing power being consumed by a background calibration 210.

As discussed above, the magnetometer calibration module 26 may determine at 208 if the active calibration parameters 236 are of sufficient quality by comparing a quality measure or score associated with the active calibration parameters 236 to a threshold. For example, a scale of 0 to 5 may be used wherein a quality score of zero is indicative of unusable magnetometer sensor readings 28, and a quality score of 5 is considered the best quality that can be achieved for the particular magnetometer sensor 24 being used, in a particular environment or application. In order to have the background calibration 210 performed only when necessary, e.g. to achieve only a level of quality that is being requested, the threshold used to determine if the current sensor readings are of sufficient quality can be adjusted according to application requirements, user preferences, etc.

Figure 13:
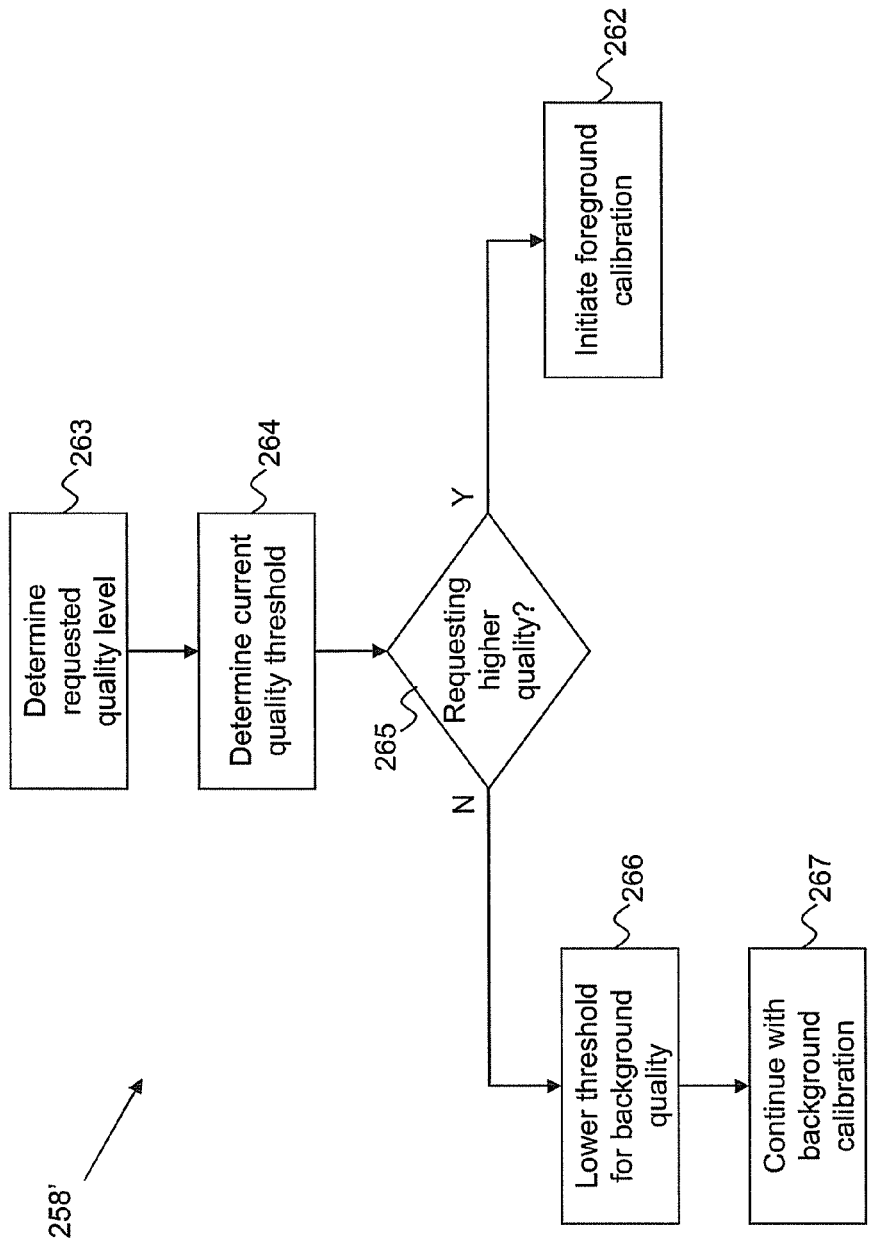
FIG. 13 is a flow chart including an example of a set of computer executable operations for adjusting a background calibration quality threshold according to a requested quality level.

Turning now to FIG. 13, an example of an embodiment 258' for performing operation 258 in FIG. 12 is shown. At 263, the magnetometer calibration module 26 determines a requested quality level, e.g. by receiving an indication of acceptable quality from a particular application 30. The magnetometer calibration module 26 may then determine the current quality threshold at 264 and determines at 265 whether or not the application 30 is requesting a higher quality than the quality level indicated by the threshold. If the application 30 is requesting a higher quality level than the threshold, this indicates that the background calibration 210 may not achieve the quality that is deemed sufficient by the application 30, or may take an excessive amount of time to achieve that quality level, and a foreground calibration 218 can be initiated at 262, which typically enables a higher quality calibration to be obtained in a shorter amount of time, due to the active user involvement in performing particular gestures.

If the quality level being requested by the application 30 is lower than the threshold, the threshold may be lowered at 266 to enable, for example, an ongoing background calibration 218 such as that shown in FIG. 7 to be stopped sooner, i.e. to accept lower quality calibrations. In other words, the quality threshold for a background calibration may be lowered when the current quality level exceeds a threshold quality level needed by an application utilizing the magnetometer readings 28. The background calibration 218 may continue at 267, e.g. if the current sensor readings are of poorer quality than the threshold even after lowering the threshold. It can be appreciated that by enabling the threshold used to determine whether to continue performing a background calibration 210, the magnetometer calibration module 26 can minimize the amount of processor burden when a lower quality level is acceptable to the application 30.

Figure 14:
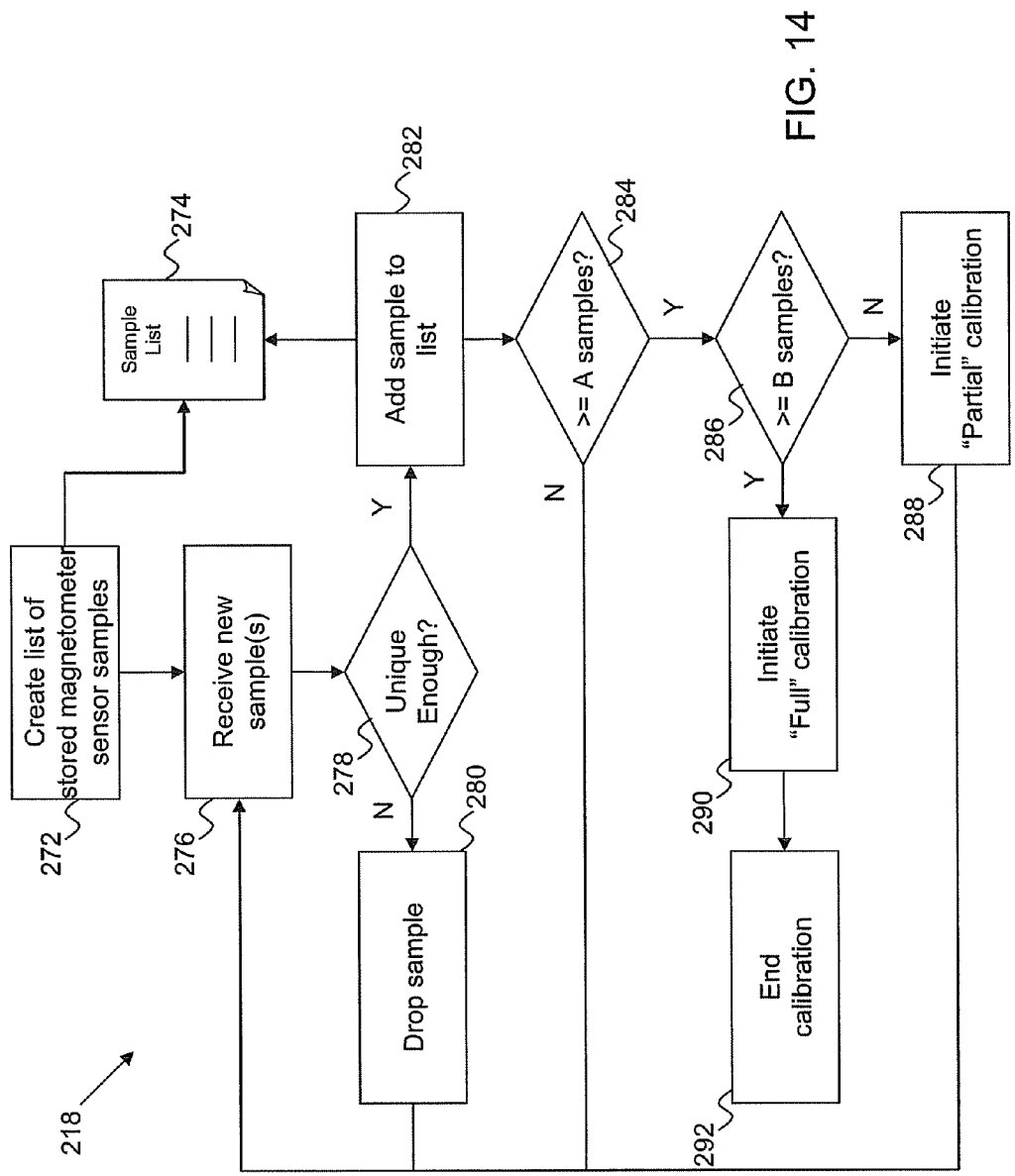
FIG. 14 is a flow chart including an example of a set of computer executable operations for performing a foreground calibration.

An example of a set of computer executable operations for performing a foreground calibration 218 is shown in FIG. 14. In this example, the foreground calibration 218 may be in three states, namely: UNCALIBRATED, UNCALIBRATED_DCO, and CALIBRATED. At 272, a list 274 of stored magnetometer sensor samples is created. Initially, the list 274 is empty and the foreground calibration 218 enters the UNCALIBRATED state. The magnetometer calibration module 26 then receives one or more new samples at 276. As the new samples arrive, they are compared at 278 with those samples already stored in the list 274 to determine if the new samples are unique enough. Any new sample which is deemed to be too similar to any of the previously stored samples is thus dropped at 280. There are various ways to determine whether or not the received sample is "too close" or "not unique enough". For example, one way is to drop samples which are identical to one or more previously stored samples. To provide improved performance, other metrics can be used such as the minimum Euclidean distance between the new sample and every previously-stored sample. If the minimum Euclidean distance is above a threshold, the newly arrived sample may be deemed "sufficiently different or unique" and added to the list 274 at 282.

The magnetometer calibration module 26 then determines at 284 and 286 if enough samples have been accumulated in order to initiate the partial calibration 212 at 288. As will be explained in greater detail below, the partial calibration 212 can be used to correct Constant bias only, which is faster than performing a calibration of all three parameters and can be used to assist in increasing the number of samples in the list 274. In FIG. 12 it can be seen that between A and B samples are required to initiate the partial calibration 212 at 288. The number of samples represented by A and B may be chosen according to the techniques used in the partial 212 and full 214 calibrations. For example, as explained below, the partial 212 and full 214 calibrations in the examples provided herein require at least 3 data points to perform a least squares fitting method for constant bias (e.g. DC offset) only (i.e. A>=3), and require at least 9 data points to perform a least squares fitting method for all three parameters (i.e. B>=9). A and B can be set as the minimum requirements or can be higher if desired. However, as will be shown, by requiring 4 values, the first, second and third values can be used to compute a constant bias for the first, second and third axes and the fourth value can be used to determine the radius of the sphere.

In the present example, once the number of readings in the list 274 is greater than or equal to 4, but not yet greater than or equal to 9, the partial calibration 212 is initiated at 288. The partial calibration 212 may be repeated in order to more quickly increase the number of readings in the list 274 in order to get to the full calibration 290. Once the fast calibration is successful, the foreground calibration 218 enters the UNCALIBRATED_DCO state. If the foreground calibration 218 is in the UNCALIBRATED or UNCALIBRATED_DCO states, once 9 or more readings are in the list 274, the full calibration 214 is initiated at 290 in order to correct all three calibration parameters. Once the full calibration succeeds, the foreground calibration 218 enters the CALIBRATED state and the calibration ends at 292.

It may be noted that, in this example, if the foreground calibration 218 is in the UNCALIBRATED_DCO or CALIBRATED states, the calibration corrections may be applied to the raw input sensor data in order to obtain the calibrated output data. With the foreground calibration 218 complete, as was discussed above, the ongoing calibration 204 takes over, e.g. to perform background calibration 210 when appropriate.

It can be appreciated that separating the foreground calibration 218 into two stages, a first stage comprising a partial calibration 212 and a second stage comprising a full calibration 214, several desirable advantages can be realized. The partial calibration 212 initially provides coarse heading information with very little device movement required. As the user continues to move the mobile device 10, the partial calibration 212 is able continually refine the calibration. Once the user has moved the mobile device 10 through more movements, a full and accurate calibration is performed to compensate for all three parameters. In other words, as the user begins moving the mobile device 10, the magnetometer calibration module 26 can quickly begin calibrating the magnetometer 24, even if the user has not yet significantly moved the mobile device 10.

The background calibration 210 may be performed on an ongoing basis when the magnetometer calibration module 26 detects that the quality of the magnetometer sensor readings 28 are not of sufficient quality (e.g. above a particular threshold as shown in FIG. 7). The background calibration 210 is thus used to continually improve the accuracy of the calibration, without requiring user intervention or special gestures or movements. This differs from the foreground calibration 218 discussed above, which is invoked when a calibration is requested by an application 30, OS 134, user, etc. However, as will be seen below, the background calibration 210 utilizes many of the same techniques used in the foreground calibration 218, namely operations 272 through 292 in FIG. 14.

Figure 15:
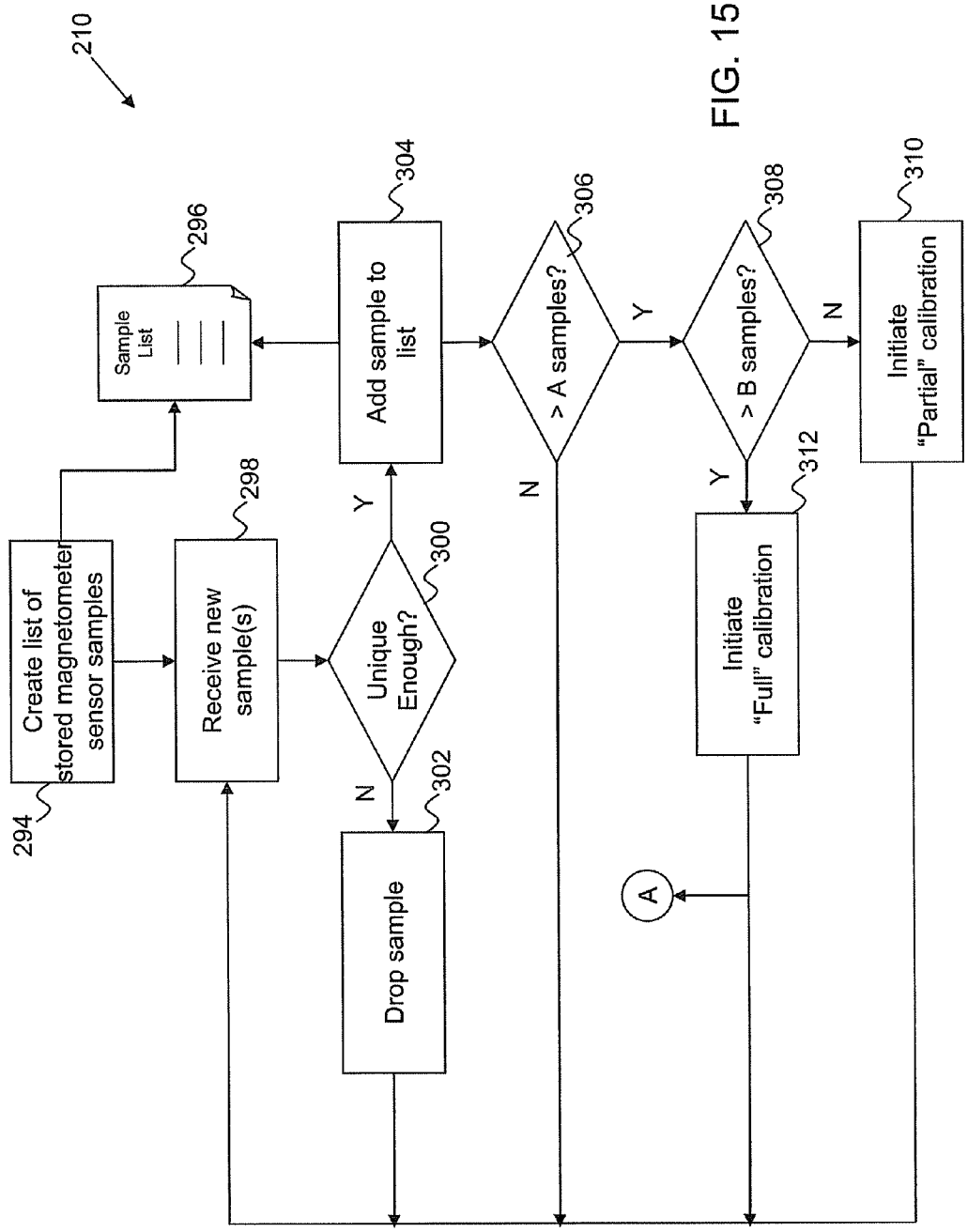
FIG. 15 is a flow chart including an example of a set of computer executable operations for performing a background calibration.

Turning now to FIG. 15, an example set of computer executable operations for enabling the magnetometer calibration module 26 to perform a background calibration 210 is shown. In this example, the background calibration 210 has four states, namely: CALIBRATED, CALIBRATED_SEARCHING, CALIBRATED_SEARCHING_DCO, and CALIBRATED_TESTING. Since the background calibration 210 is ongoing, the background calibration 210 is normally in the CALIBRATED state. As noted above, in this state, the calibration quality is continually being checked (at 206—see FIG. 7). The magnetometer calibration module 26 (or a module dedicated to the background calibration 210) may keep an average of, e.g. 100 quality estimates. If the average quality over that period drops below a pre-defined threshold, the magnetometer calibration module 26 determines that background calibration 210 is required and enters the CALIBRATED_SEARCHING state and the method in FIG. 15 begins.

When in the UNCALIBRATED state, at 294, a list 296 of stored magnetometer sensor samples is created. Initially, the list 296 is empty. The magnetometer calibration module 26 then receives one or more new samples at 298. As these new samples arrive, they are compared at 300 with those samples already stored in the list 296 to determine if the new samples are unique enough. Any new sample which is deemed to be too similar to any of the previously stored samples is thus dropped at 302. There are various ways to determine whether or not the received sample is "too close" or "not unique enough". For example, one way is to drop samples which are identical to one or more previously stored samples. To provide improved performance, other metrics can be used such as the minimum Euclidean distance between the new sample and every previously-stored sample. If the minimum Euclidean distance is above a threshold, the newly arrived sample may be deemed "sufficiently different or unique" and added to the list 296 at 304.

The magnetometer calibration module 26 then determines at 306 and 308 if enough samples have been accumulated in order to initiate the partial calibration 212 at 310. As will be explained in greater detail below, the partial calibration 212 can be used to correct constant bias only, which is faster than performing a calibration of all three parameters and can be used to assist in increasing the number of samples in the list 296. In FIG. 15 it can be seen that between A and B samples are required to initiate the partial calibration 212 at 310. The number of samples represented by A and B may be chosen according to the techniques used in the partial 212 and full 214 calibrations. For example, as explained below, the partial 212 and full 214 calibrations in the examples provided herein require at least 3 data points to perform a least squares fitting method for constant bias only (i.e. A>=3)—but may use a fourth data point to determine the radius of the sphere, and require at least 9 data points to perform a least squares fitting method for all three parameters (i.e. B>=9). A and B can be set as the minimum requirements or can be higher if desired.

In the present example, once the number of readings in the list 296 is greater than or equal to 4, but not yet greater than or equal to 9, the partial calibration 212 is initiated at 310 and the background calibration 210 enters the CALIBRATED_SEARCHING_DCO state. The partial calibration 212 may be repeated in order to more quickly increase the number of readings in the list 296 in order to improve the partial calibration 212. If the background calibration 210 is in the CALIBRATED_SEARCHING or CALIBRATED_SEARCHING_DCO states, once 9 or more readings are in the list 296, the full calibration 214 is initiated at 312 in order to correct all three calibration parameters. Once the full calibration succeeds, the background calibration 210 enters the CALIBRATED_TESTING state.

It may be noted that in all states, stored correction values from previous foreground calibrations 218 may be applied to the raw sensor data. The thus calibrated data (based on foreground calibration parameters) is then checked for quality and the result stored (not shown). The foreground qualities may then be averaged over, e.g. 100 samples. If the average foreground quality exceeds a predefined threshold, then the background calibration 210 is determined to no longer be needed. In this case, the background calibration 210 returns to the CALIBRATED state without completing. It can be appreciated that since foreground calibrations 218 may be performed separately from the background calibrations 210 if the magnetometer calibration module 26 was already able to achieve sufficient calibration, it can minimize processor load by prematurely ending the background calibration 210.

It may also be noted that in this example embodiment, if the background calibration 210 is in the CALIBRATED_SEARCHING_DCO or CALIBRATED_TESTING states, the background calibration corrections may be applied to the raw input sensor data in order to obtain the calibrated output data. The calibrated measurements may then be checked for quality and the results stored. An average of background qualities may then be obtained, e.g. over 100 measurements. In other words, after a full calibration has been performed at 312, before accepting the new calibration parameters of as the active calibration parameters, the new calibration parameters are tested while sample continue to be acquired such that the new calibration parameters can be tested while the active calibration parameters can continue to be used.

Figure 16:
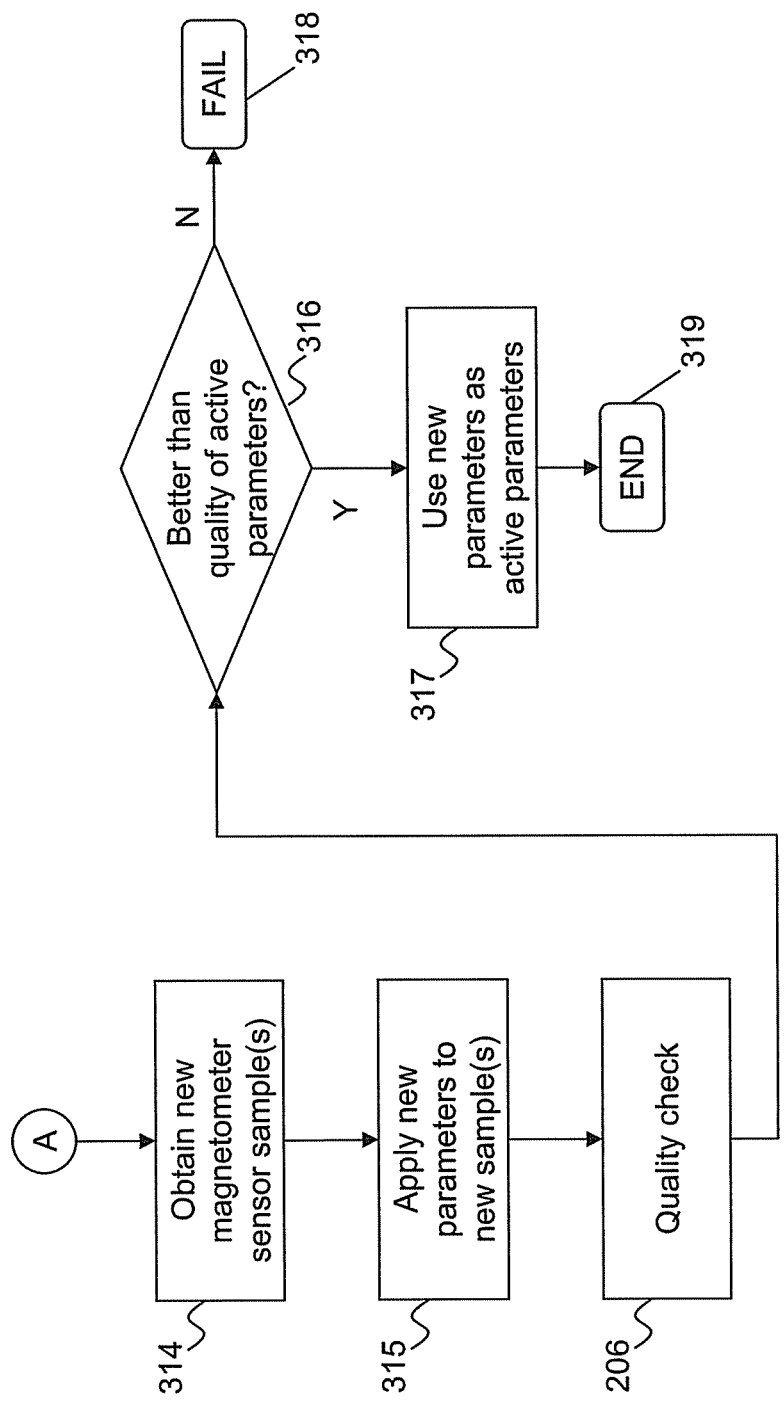
FIG. 16 is a flow chart including an example of a set of computer executable operations for testing the quality of a set of new calibration parameters.

After the full calibration is performed at 218, the magnetometer calibration module 26 may perform a background parameter testing phase at A by executing the operations shown in FIG. 16. The background parameter testing phase initiated at A may be used to determine if the newly acquired background calibration parameters, when applied to the raw sensor data, achieve qualities that are better than the qualities that are being achieved using the active calibration parameters 236. For example, if a foreground calibration 218 had recently been performed and the quality of that calibration continues to be of sufficient quality, there is no need to replace those calibration parameters with the new background calibration parameters, in particular if the new background parameters are of poorer quality. It can be appreciated that performing such a parameter testing phase as shown in FIG. 16 can prevent the replacement of good calibration parameters with poorer calibration parameters. In this example embodiment, if the background parameters are not better than the active calibration parameters, the background calibration 210 has failed and the background calibration 210 returns to the CALIBRATED_SEARCHING state. If however, the background qualities are better, the background calibration 210 has succeeded and the new calibration parameters are applied as the active calibration parameters and the old active calibration parameters are deleted. The background calibration 218 may then return to the CALIBRATED state.

Turning now to FIG. 16, an example set of computer executable operations are shown that may be executed in performing a background parameter testing phase A. At 314, one or more new magnetometer sensor samples are obtained. The new magnetometer sensor samples would have been subjected to an active set of calibration parameters to obtain a plurality of values that may be used by an application using the magnetometer 25. At 315, the new set of calibration parameters is applied to the new sample(s) to obtain a plurality of further values. A quality check may then be performed at 206 on the plurality of further values, e.g. as shown in FIG. 9. The magnetometer calibration module 26 then determines at 316 if the new calibration parameters are better than the quality of the active parameters, where the quality of the active parameters is continually stored with the magnetometer sensor readings 28, as discussed above. If the new calibration parameters are not of better quality than the active calibration parameters, the background calibration 210 fails at 318. If however the new parameters are of better quality, the new parameters are set to be the active calibration parameters at 317, and the method ends at 319, with the background calibration 210 having been successful. In other words, the active set of calibration parameters are replaced with the new set of calibration parameters when a quality of the plurality of values obtained using the new parameters is higher than a quality of the further values obtained using the active parameters.

As discussed above, both the foreground calibration 218 and background calibration 210 may utilize a partial calibration 212 to estimate and remove a constant bias from a set of readings, in this example of a three-axis magnetometer 24. Removing such an offset is considered important as it is a main contributor to the overall magnetometer inaccuracy.

Figure 17:
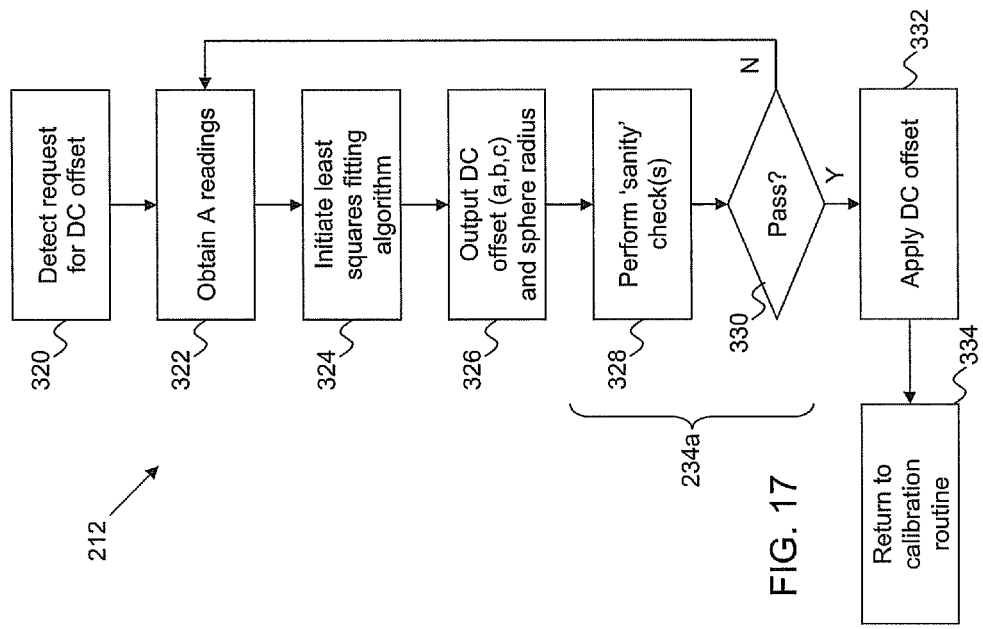
FIG. 17 is a flow chart including an example of a set of computer executable operations for performing a partial calibration.

The partial calibration 212 is initiated when 3 or more sufficiently different or unique readings have been obtained, i.e. in this example embodiment, at least 3 different readings are required to determine a first of the plurality of calibration parameters. FIG. 17 illustrates an example set of computer executable instructions for performing the partial calibration 212. At 320, the magnetometer calibration module 26 detects a request for a constant bias (i.e. the "partial" calibration). The A readings that are different (e.g. 3 or more—in this example 4 to determine radius of sphere) are obtained at 322, and a least squares fitting algorithm is initiated at 324. The least squares fitting algorithm is used to find the best fit of the raw data to the model being used. It has been found that a suitable model assumes that the magnetic field is spherical with radius R and center at (t, u, v), namely: $(X-t)^2+(Y-u)^2+(Z-v)^2=R^2$. The output of the least squares fitting algorithm is then obtained at 326 and includes the values (t, u, v), and the radius R. The outputs, i.e. new calibration parameters may then be subjected to one or more tests 234a or "sanity" checked at 328 to discard obviously erroneous results. For example, the minimum and maximum total magnetic strength over the entire earth are known and thus results that have an R value outside of this range can be deleted. Also, based on, for example, the mobile device's ADC (analog-to-digital conversion) range, upper and lower bounds of possible ranges of constant bias can be performed to also eliminate likely erroneous results. Once a constant bias is found to pass the sanity checks at 330, it can be applied at 332 to correct the raw sensor readings, by subtracting the estimated constant bias for each axis. The magnetometer calibration module 26 may then return to the calibration routine which requested the partial calibration at 334 (i.e. the foreground calibration 218 or background calibration 210).

The full calibration 214 is used to estimate and remove the effects of not only constant bias, but also gain and inter-axis misalignment errors from a set of readings of a three-axis magnetometer sensor 24. Removing such effects is important in order to minimize the overall inaccuracy of the magnetometer sensor 24 and the applications 30 utilizing the magnetometer sensor readings 28.

Figure 18:
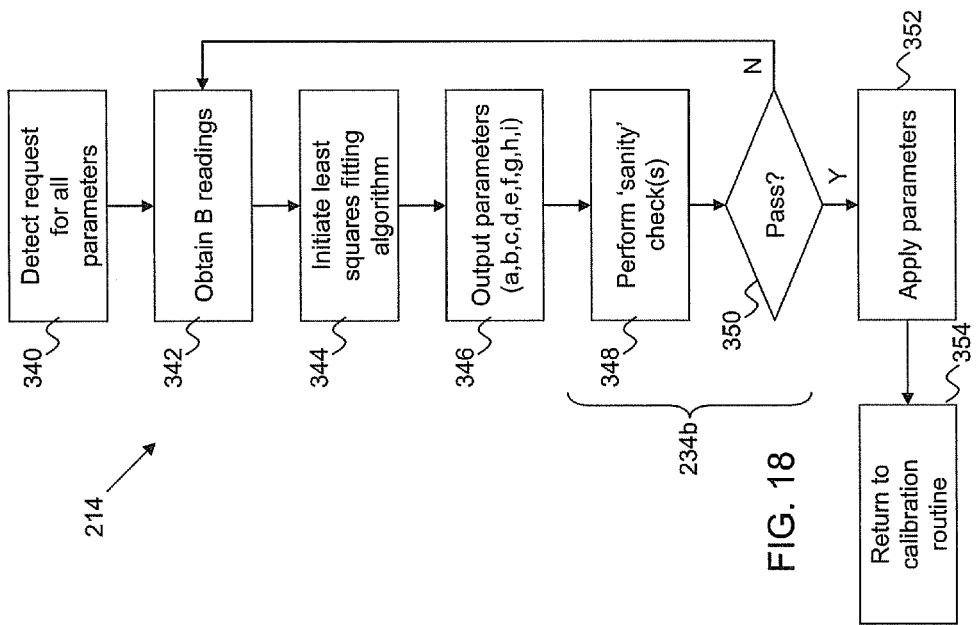
FIG. 18 is a flow chart including an example of a set of computer executable operations for performing a full calibration.

The full calibration 214 is initiated when 9 or more sufficiently different or unique readings have been obtained, i.e. in this example embodiment, at least 9 different readings are required to determine the plurality of calibration parameters. FIG. 18 illustrates an example of a set of computer executable instructions for performing the full calibration 214. At 340, the magnetometer calibration module 26 detects a request for all three parameters to be corrected (i.e. the "full" calibration). The B readings that are different (e.g. 9 or more) are obtained at 342, and a least squares fitting algorithm is initiated at 344. The least squares fitting algorithm is used to find the best fit of the raw data to the model being used. It has been found that a suitable model assumes that the magnetic field has a center at (a, b, c) namely: $aX^2+bY^2+cZ^2+dXY+eXZ+fYZ+gX+hY+iZ=1$. The output of the least squares fitting algorithm is then obtained at 346 and includes the values (a, b, c, d, e, f, g, h, i), which are converted into gains, offsets and angles through a transformation as will be explained in greater detail below. The outputs may then be subjected to one or more tests 234b or "sanity" checked at 348 to discard obviously erroneous results. For example, the quadratic equation above can represent many geometric shapes such as hyperboloids, cones, etc. However, it is understood from the physics of the magnetometer sensor 24 that the correct solution to the model should be an ellipsoid. Thus, any non-ellipsoid solutions can be discarded. Additionally, other sanity checks such as knowledge of the minimum and maximum possible constant biases, allowable range of gains, etc. can be used to discard other erroneous values. Once a constant bias is found to pass the sanity checks at 350, it can be applied at 352 to correct the raw sensor readings, by applying the calibration parameters to the incoming raw sensor samples in order to compensate for the biases, gains, and misalignment errors. The magnetometer calibration module 26 may then return to the calibration routine which requested the partial calibration at 354 (i.e. the foreground calibration 218 or background calibration 210).

An example 9-point full calibration and an example 4-point partial calibration using a least square algorithm will now be provided.

For a 9-point "full" calibration, using least-squares, the following equation is solved:

$$aX^2+bY^2+cZ^2+dXY+eXZ+fYZ+gX+hY+iZ=1$$

Solving this equation results in the values for a, b, c, d, e, f, g, h, and i. These values are then converted as follows:

$$q1=\operatorname{sqrt}(a);$$

$$q2=d/(2*q1);$$

$$q3=e/(2*q1);$$

$$q4=g/(2*q1);$$

$$q5=\operatorname{sqrt}(b-q2^2);$$

$$q6=(f/2-q2*q3)/q5;$$

$$q7=(h/2-q2*q4)/q5;$$

$$q8=\operatorname{sqrt}(c-q3^2-q6^2);$$

$$q9=(i/2-q3*q4-q6*q7)/q8;$$

The different q values then form the following matrix:

$$\text{Transform}=\begin{bmatrix} q1 & q2 & q3 & q4 \\ 0 & q5 & q6 & q7 \\ 0 & 0 & q8 & q9 \\ 0 & 0 & 0 & 1 \end{bmatrix}$$

The T matrix above is then scaled so that it has the appropriate magnitude. If you have a raw sample point (x,y,z) and you want to use the calibration parameters to correct it, you can do the following:

1) Create the column vector: Input=$[x\ y\ z\ 1]^T$
2) Calculate the Matrix-vector product: Output=Transform*Input
3) Then the Output vector has the corrected x, y and z in entries 1, 2, and 3.

It may be noted that the centers, gains and angles may not need to be calculated in order to apply the compensation method. Instead, only the Transform matrix as described above may be required.

For the 4-point "partial" calibration, using least-squares, the following equation is solved:

$$tX+uY+vZ+w=(-X^2+Y^2+Z^2)$$

From this equation, solutions for parameters t, u, v, and w are obtained. The following transformation matrix Transform can be obtained:

$$\text{Transform}=\begin{bmatrix} 1 & 0 & 0 & (t/2) \\ 0 & 1 & 0 & (u/2) \\ 0 & 0 & 1 & (v/2) \\ 0 & 0 & 0 & 1 \end{bmatrix}$$

The estimated radius is given by:

Radius=Sqrt$((-t/2)^2+(-u/2)^2+(-v/2)^2-w)$, and the estimated Constant bias can be obtained by feeding the Transform matrix into the routine below.

To determine the estimated center, gains and angles from the T matrix, the following function may be used:

function[center gains angles]=calcTransformParams (T)

$iT=\operatorname{inv}(T);$ $gz=iT(3,3);$ $gy=\operatorname{sqrt}(iT(2,2).^2+iT(2,3).^2);$ $s\text{phi}=-iT(2,3)/gy;$ phi=$a$ sin $d$(sphi);

$gx=\operatorname{sqrt}(\operatorname{sum}(iT(1,1:3).^2));$ $s\text{lambda}=-iT(1,3)/gx;$ lambda=$a$ sin $d$(slambda);

$s\text{rho}=-iT(1,2)/gx/\cos d(\text{lambda});$ rho=$a$ sin $d$(srho);

center=$iT(1:3,4)'$;

gains=$[gx\ gy\ gz]$;

angles=[rho phi lambda];

end

Figure 19:
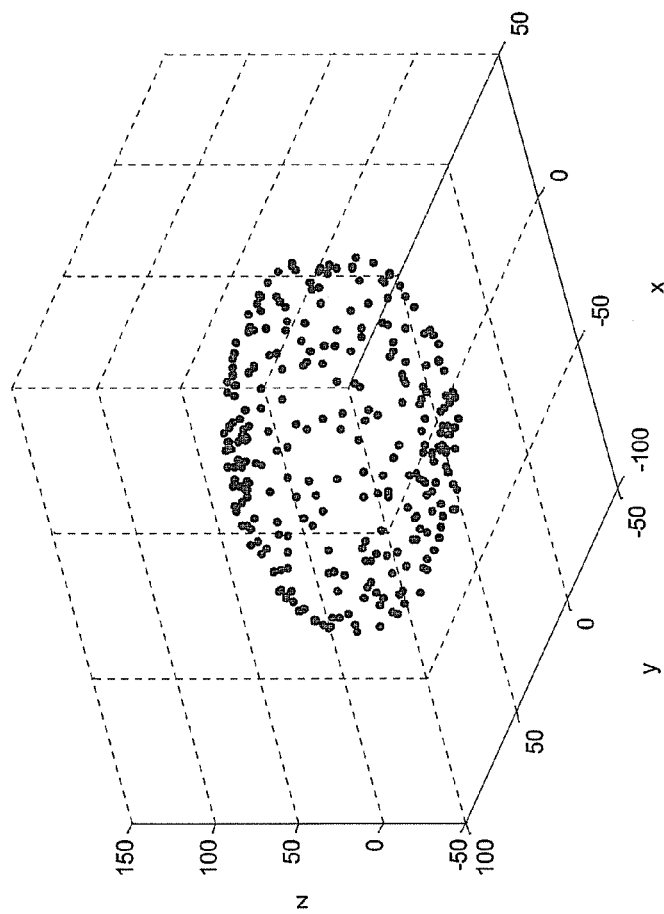
FIGS. 19 to 21 are data point graphs for illustrating effects of applying a least squares fitting algorithm.

An example of 4-point and 9-point calibration is shown in FIG. 19. The points shown have an actual constant bias of (−30,20,40), gains of (1,0.9,1.1), misalignment angles of (2,−3,0) degrees and a radius of 55.

Using the 4-point "partial" calibration, the following values can be estimated:

Estimated Constant bias=(−29.8115, 19.9337, 38.8898)
Estimated radius=55.5717
And the transform matrix:

| 1.0000 | 0 | 0 | 29.8115 |
| 0 | 1.0000 | 0 | −19.9337 |
| 0 | 0 | 1.0000 | −38.8898 |
| 0 | 0 | 0 | 1.0000 |

Figure 20:
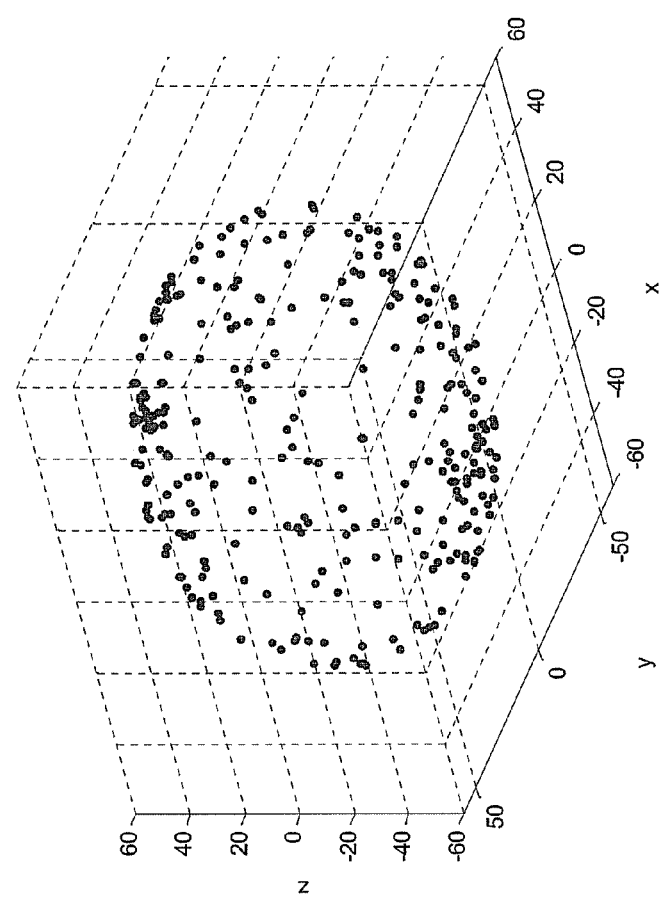

These parameters may then be used to correct the points resulting in the example shown in FIG. 20.

Using the 9-point "full" calibration, the following values may be estimated:

Estimated Constant bias=(−29.8796, 20.0476, 39.9490)
Estimated gains=(1.0074, 0.8972, 1.0963)
Estimated angles=(−2.1244, 2.6167, 0.0184)
And the transform matrix:

| 0.9933 | −0.0414 | −0.0013 | 30.5589 |
| 0 | 1.1157 | 0.0417 | −24.0332 |
| 0 | 0 | 0.9122 | −36.4408 |
| 0 | 0 | 0 | 1.0000 |

Figure 21:
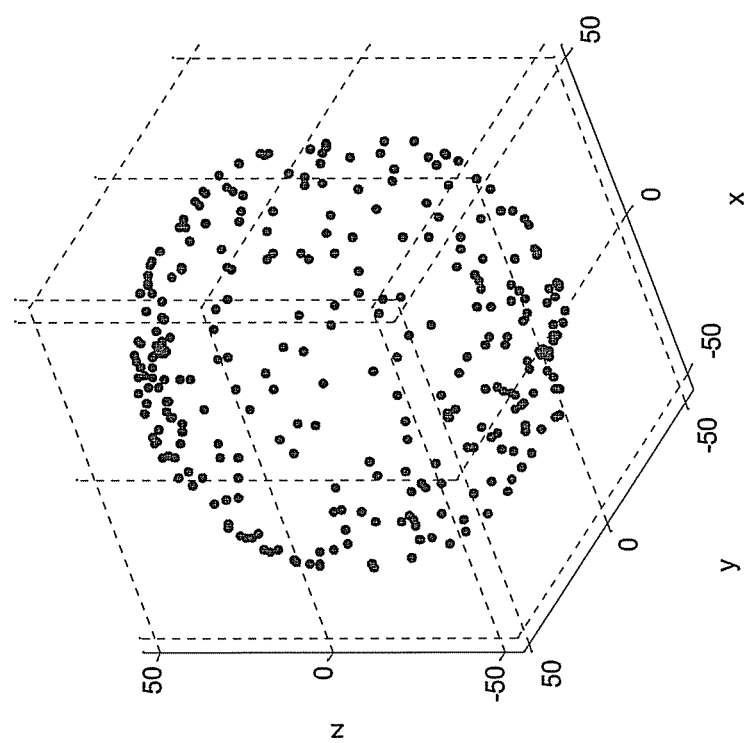

When these parameters are used to correct the points of the above figure, the corrected data shown in FIG. 21 is obtained.

Figure 22:
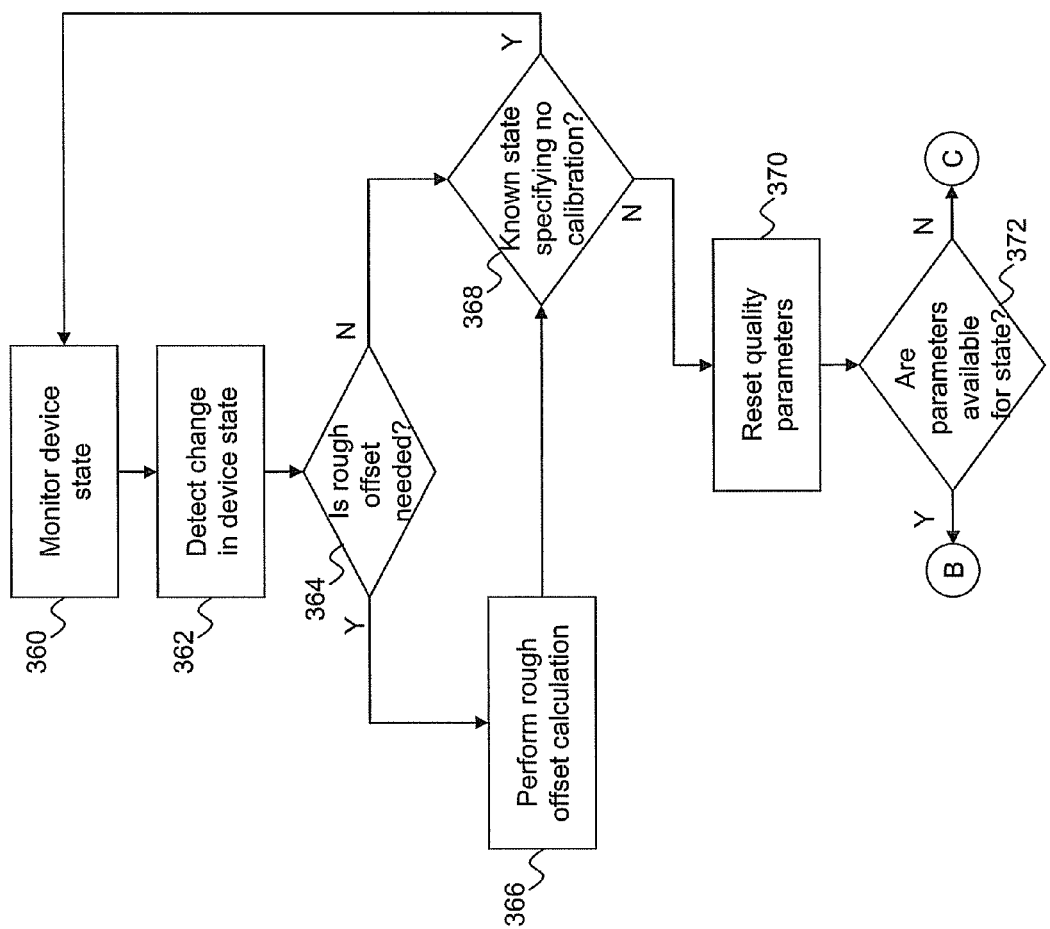
FIG. 22 is a flow chart including an example of a set of computer executable operations for initiating a calibration method based on a detected change in device state.

Returning to FIG. 7, as discussed above, changes in device state detected at 226 can be used to initiate a branch of the ongoing calibration 204, in order to compensate or account for changing environments or effects from moving between different states. For example, the holster, slider and flip states shown in FIGS. 2 to 4 (i.e. holstered/unholstered, and opened/closed states as determined by device sensors) can be used to determine when to re-calibrate the magnetometer 25. It has been recognized that changes in these states can have a direct impact on the performance of the magnetometer 25. For example, a slider mechanism for sliding the keyboard 12 out from behind a touch screen display 13 may include various metal parts as well as several magnets. It has been found that the performance of the magnetometer 25 and the resultant calibration parameters that would be calculated can be very different depending on when the slider is opened versus closed. As such, the holster, slider, and flip states may therefore be monitored at 360 to detect a change in state at 362 as shown in FIG. 22.

The magnetometer calibration module 26 in this example may be programmed to continually track or otherwise become aware of the current state of the mobile device 10. The current state in this example, when known, may be denoted K, and any N number of states may be tracked. For example, a slider-equipped device such as that shown in FIG. 3 may have N=3 states, namely K=0 when out of holster and slider closed, K=1 when out of holster and slider opened, and K=2 when in holster (assuming the slider cannot be opened when the mobile device 10 is holstered). It can be appreciated that different device types may have different numbers of states and thus different allowable ranges for K. It can also be appreciated that the current state may not be known but new calibration parameters can be generated and stored and a new state K can be created as will be discussed below.

The magnetometer calibration module 26 upon detecting a change in device state at 362 then determines if a rough offset calculation is needed at 364. The rough offset calculation is a hardware offset that can be applied by the magnetometer sensor 24 to bring it back into a useable range. It has been found that some magnetometer sensors 24 (e.g. Aichi Steel AMI306) contain a measurement range of +/−12 Gauss, with a moving range of +/−3 Gauss. This means that the magnetometer sensor 24 is capable of measuring from −12 to 12 Gauss, but only with a window of 6 Gauss. When the physical environment that the magnetometer sensor 24 experiences changes, the magnetic field that is present might fall outside of the 6 Gauss window. The magnetometer sensor 24 could then be saturated at either extreme, rendering the magnetometer sensor 24 ineffective. It can be appreciated that saturated can mean that, even though the actual magnetic field values are changing, the magnetometer sensor 24 cannot detect/report the changes since the values are outside of the range of the window. As such, the user may observe that the reading being displayed in a particular application 30 being used does not change at all as the mobile device 10 is moved.

It has therefore been recognized that changes in device states can be used to trigger the magnetometer sensor 24 to perform a hardware offset calculation to bring it back into a useable range. Flipping or sliding a mobile device 10 typically changes the physical environment and may alter the magnetic field present. When a device sensor (e.g. one that can detect a flip, slide, holstering, etc.) detects this change, a magnetometer hardware offset calibration is performed at 366. This will allow the sensor to continue to observe the magnetic field, thus allowing the magnetometer calibration module 26 to recalibrate to the current magnetic field.

Whether or not the rough offset is needed and applied, the magnetometer calibration module 26 may then determine if the current state is a known state K that specifies that no calibration is needed at 368. In the case of certain physical device configurations, it has been found that the magnetometer sensor 24 does not perform well, or possibly even work at all. For example, the device holster 20 may contain large magnets (both to activate the holster sensor as well as to keep the holster flap closed). When the mobile device 10 is inside the holster, the magnetometer sensor 24 and applications 30 using it likely will not work. For such device configurations, the magnetometer calibration module 26 can use the indication of a known state K to avoid attempting to re-calibrate the magnetometer sensor 24 in an environment in which the magnetometer sensor 24 likely cannot be calibrated. Moreover, in states such as a holstered state, it may be more likely that the applications 30 using the magnetometer 25 are not being used since the holster 20 effectively stows the mobile device 10 providing further incentive to avoid unnecessary calibrations.

If a calibration is to be performed, the magnetometer calibration module 26 can reset the quality parameters at 370, i.e. it can discard the stored quality history from the previous state. This can be important because the quality check at 206 relies on having stored quality information over a number of successive readings and, if the physical environment in which those samples were taken has changed, the samples should be discarded to avoid reporting incorrect quality measures.

The magnetometer calibration module 26 can store or otherwise determine a different set of calibration parameters for each value of K, i.e. for each known state. The magnetometer calibration module 26 can then determine at 372 if parameters are available for the current state, such that the module 26 can load the appropriate parameters for the new K value whenever K changes, or generate new calibration parameters for a known state K that does not currently have a set of calibration parameters, or by determining that new state exists and generating a new K value and a corresponding set of calibration parameters. If stored parameters exist, the method proceeds to B, operations for which are illustrated in FIG. 23.

Turning to FIG. 23, when it is determined that calibration parameters exist for a known state K, the stored calibration parameters in this example are loaded at 374. A previous set of calibration parameters for a known state K typically includes all three parameters, namely the gain, inter-axis misalignment, and constant bias for each axis. However, due to environmental changes (e.g. changes in location), whether or not the rough offset has been performed at 364, or by determining any other criterion that suggests that new constant bias parameters should be obtained, the magnetometer calibration module 26 may load only the gain and inter-axis misalignment parameters and obtain fresh constant bias parameters. In this example embodiment, the magnetometer calibration module 26 determines at 375 whether or not new constant bias parameters are needed. If so, a calibration may be performed at 376 to obtain a constant bias (e.g. partial calibration 212) to get fresh constant bias parameters. If the currently stored constant bias parameters are determined to be sufficient and new constant bias parameters are not needed, the gain, inter-axis misalignment, and constant bias parameters are applied as the active calibration parameters at 377. It can be appreciated that in some example embodiments, e.g. wherein it is typically determined that fresh constant bias parameters are required, only the gain and inter-axis misalignment parameters may be stored and loaded for the particular state. Since different states may affect the magnetometer sensor 24 in different ways, storing only the gain and inter-axis misalignment parameters for certain states may be a more efficient and less storage consuming way to load calibration parameters for such states.

Turning now to FIG. 24, if no stored calibration parameters exist yet for a known state K (e.g. if it is the first time that the user has used the mobile device 10 in that state), or the current state is unknown or otherwise not yet associated with a state K, the magnetometer calibration module 26 can calibrate the magnetometer 25 using a full calibration 214 at 378. The magnetometer calibration module 26 may then determine at 375 whether the state is new or known. If the current state is a known state K, the newly acquired calibration parameters for K may be stored at 380, e.g. in non-volatile memory, so that they can be used again whenever the mobile device 10 is used in that state K. If the current state is not a known state K, but the state is determined to be a common or otherwise repeatable state (e.g. when tethered to another device, accessing a particular Wi-Fi network, paired with a known other device via Bluetooth, etc.), a detectable characteristic is determined at 382 and the characteristic stored with the newly acquired calibration parameters at 384. In this way, a new state K is created and the associated parameters stored for subsequent use. When the detectable characteristic is detected, the new state K can be used to access and load the previously stored calibration parameters.

The detectable characteristic can be determined automatically, e.g. using something detected by the OS 134 or an application 30, 32, or by prompting the user to identify the new state. For example, after determining that the mobile device 10 is in a new or otherwise previously unaccounted for state, the magnetometer calibration module 26 may prompt the user to confirm that the detectable characteristic can be associated with a state and have the user identify the state. This enables the magnetometer calibration module 26 identify or be notified of a potential new state and have this information confirmed. For example, the OS 134 may indicate that the mobile device 10 is paired with a particular device or connected to a network (e.g. via Wi-Fi). The prompt provided by the magnetometer calibration module 26 may then indicate the presence of this pairing or network connection and ask the user to confirm that a new state K may be associated with that pairing or connection.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

The steps or operations in the flow charts and diagrams described herein are just for example. There may be many variations to these steps or operations without departing from the spirit of the invention or inventions. For instance, the steps may be performed in a differing order, or steps may be added, deleted, or modified.

Although the above principles have been described with reference to certain specific embodiments, various modifications thereof will be apparent to those skilled in the art without departing from the scope of the claims appended hereto.

The invention claimed is:

1. A method of calibrating a magnetometer on a mobile device, the method comprising:
   determining a current quality level associated with magnetometer readings obtained using an active set of calibration parameters; and
   lowering a quality threshold for a background calibration of the magnetometer when the current quality level exceeds a threshold quality level needed by an application utilizing the magnetometer readings.

2. The method according to claim 1, wherein lowering the quality threshold prevents an ongoing background calibration from attempting to achieve a higher quality level.

3. The method according to claim 1, wherein the threshold quality level needed by the application is provided in an instruction from the application to calibrate the magnetometer.

4. The method according to claim 3, wherein the instruction is associated with an absence of calibration parameters for the magnetometer.

5. The method according to claim 1, further comprising initiating a foreground calibration of the magnetometer if the threshold quality level needed by the application is higher than the current quality level.

6. The method according to claim 1, wherein the application is any one of a digital compass application, a stud-finder application, and an augmented reality based application.

7. A non-transitory computer readable medium comprising computer executable instructions for calibrating a magnetometer on a mobile device, the computer readable medium comprising instructions for:
   determining a current quality level associated with magnetometer readings obtained using an active set of calibration parameters; and
   lowering a quality threshold for a background calibration of the magnetometer when the current quality level exceeds a threshold quality level needed by an application utilizing the magnetometer readings.

8. The non-transitory computer readable medium according to claim 7, wherein lowering the quality threshold prevents an ongoing background calibration from attempting to achieve a higher quality level.

9. The non-transitory computer readable medium according to claim 7, wherein the threshold quality level needed by the application is provided in an instruction from the application to calibrate the magnetometer.

10. The non-transitory computer readable medium according to claim 9, wherein the instruction is associated with an absence of calibration parameters for the magnetometer.

11. The non-transitory computer readable medium according to claim 7, further comprising instructions for initiating a foreground calibration of the magnetometer if the threshold quality level needed by the application is higher than the current quality level.

12. The non-transitory computer readable medium according to claim 7, wherein the application is any one of a digital compass application, a stud-finder application, and an augmented reality based application.

13. A mobile device comprising a processor coupled to a memory, and a magnetometer, the memory comprising computer executable instructions for:
   determining a current quality level associated with magnetometer readings obtained using an active set of calibration parameters; and
   lowering a quality threshold for a background calibration of the magnetometer when the current quality level exceeds a threshold quality level needed by an application utilizing the magnetometer readings.

14. The mobile device according to claim 13, wherein lowering the quality threshold prevents an ongoing background calibration from attempting to achieve a higher quality level.

15. The mobile device according to claim 13, wherein the threshold quality level needed by the application is provided in an instruction from the application to calibrate the magnetometer.

16. The mobile device according to claim 15, wherein the instruction is associated with an absence of calibration parameters for the magnetometer.

17. The mobile device according to claim 13, further comprising initiating a foreground calibration of the magnetometer if the threshold quality level needed by the application is higher than the current quality level.

18. The mobile device according to claim 13, wherein the application is any one of a digital compass application, a stud-finder application, and an augmented reality based application.

* * * * *